US009497850B2

(12) United States Patent
Melanson et al.

(10) Patent No.: US 9,497,850 B2
(45) Date of Patent: Nov. 15, 2016

(54) CONTROLLED POWER DISSIPATION IN A LIGHTING SYSTEM

(75) Inventors: John L. Melanson, Austin, TX (US); Eric J. King, Austin, TX (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 105 days.

(21) Appl. No.: 13/289,931

(22) Filed: Nov. 4, 2011

(65) Prior Publication Data

US 2012/0112665 A1    May 10, 2012

Related U.S. Application Data

(60) Provisional application No. 61/410,168, filed on Nov. 4, 2010.

(51) Int. Cl.
*H05B 37/02* (2006.01)
*H05B 39/02* (2006.01)
(Continued)

(52) U.S. Cl.
CPC ........ *H05K 1/0203* (2013.01); *H05B 33/0815* (2013.01); *H05B 33/0854* (2013.01);
(Continued)

(58) Field of Classification Search
CPC .......... H05B 33/0815; H05B 33/0809; H05B 33/0851; H05B 33/0812; H05B 33/0818; H05B 33/0827; H05B 33/0845; H05B 37/02; H05B 33/08; H05B 33/0824; H05B 41/295; H05B 41/2828; H05B 41/2928; Y10S 315/07; Y10S 315/04
USPC ............ 315/307, 291, 246, 247, 294, 169.1, 315/185 R, 318, 186, 192, 312, 177, 209 R, 315/224, 276, 297, 299, 300, 301, 308, 315/326; 345/82, 94, 102, 204, 212; 362/294, 35, 249.02, 249.05, 249.06, 362/311.02, 545; 363/21.12, 21.13, 21.15, 363/21.16, 21.17, 21.18, 97
See application file for complete search history.

(56) References Cited

U.S. PATENT DOCUMENTS 4,121,269 A * 10/1978 Hobson, Jr. .............. H02H 3/34
                                                   361/44
4,523,128 A      6/1985 Stamm et al.
(Continued)

FOREIGN PATENT DOCUMENTS

| CN | 1421986 A | 6/2003 |
|---|---|---|
| CN | 1459216 A | 11/2004 |

(Continued)

OTHER PUBLICATIONS

International Preliminary Report on Patentability issued in the corresponding PCT Application No. PCT/US2011/059447 on May 16, 2013.
(Continued)

*Primary Examiner* — Alexander H Taningco
*Assistant Examiner* — Christian L Garcia

(57) ABSTRACT

In at least one embodiment, a lighting system includes one, some, or all of a switch path, link path, and flyback path power dissipation circuits to actively and selectively control power dissipation of excess energy in a switching power converter of the lighting system. The flyback path power dissipation circuit dissipates power through a flyback path of the switching power converter. In at least one embodiment, the lighting system controls power dissipation through the flyback path by controlling a transformer primary current in the flyback path and, for example, limiting the primary current with a current source and dissipating power in the flyback switch and the current source.

31 Claims, 15 Drawing Sheets

(51) Int. Cl.
*H05B 39/04* (2006.01)
*H05B 41/36* (2006.01)
*H05K 1/02* (2006.01)
*H05B 33/08* (2006.01)

(52) U.S. Cl.
CPC ........... *H05B33/08* (2013.01); *H05B 33/0809* (2013.01); *H05B 33/0812* (2013.01); *H05B 33/0818* (2013.01); *H05B 33/0824* (2013.01); *H05B 33/0827* (2013.01); *H05B 33/0845* (2013.01); *H05B 33/0851* (2013.01); *H05B 37/02* (2013.01); *Y02B 20/19* (2013.01); *Y02B 20/346* (2013.01); *Y02B 20/347* (2013.01)

(56) References Cited

U.S. PATENT DOCUMENTS

| | | | |
|---|---|---|---|
| 4,724,364 A * | 2/1988 | Newton | H04N 9/645 315/383 |
| 5,055,746 A | 10/1991 | Hu et al. | |
| 5,179,324 A | 1/1993 | Audbert | |
| 5,319,301 A | 6/1994 | Callahan et al. | |
| 5,321,350 A | 6/1994 | Haas | |
| 5,430,635 A | 7/1995 | Liu | |
| 5,691,605 A | 11/1997 | Xia et al. | |
| 5,770,928 A | 6/1998 | Chansky et al. | |
| 5,963,023 A | 10/1999 | Herrell et al. | |
| 6,043,635 A | 3/2000 | Downey | |
| 6,046,550 A | 4/2000 | Ference et al. | |
| 6,091,205 A | 7/2000 | Newman et al. | |
| 6,211,624 B1 | 4/2001 | Holzer | |
| 6,343,022 B1 | 1/2002 | Naruse | |
| 6,380,692 B1 | 4/2002 | Newman et al. | |
| 6,407,514 B1 | 6/2002 | Glaser et al. | |
| 6,420,842 B1 * | 7/2002 | Gold | H02H 7/06 307/113 |
| 6,510,995 B2 | 1/2003 | Muthu et al. | |
| 6,621,256 B2 | 9/2003 | Muratov et al. | |
| 6,713,974 B2 | 3/2004 | Patchornik et al. | |
| 6,791,279 B1 * | 9/2004 | Shearer | H05B 41/2822 315/209 R |
| 6,819,538 B2 | 11/2004 | Blaauw et al. | |
| 6,858,995 B2 | 2/2005 | Lee et al. | |
| 6,900,599 B2 | 5/2005 | Ribarich | |
| 7,102,902 B1 | 9/2006 | Brown et al. | |
| 7,180,250 B1 | 2/2007 | Gannon | |
| 7,184,937 B1 | 2/2007 | Su et al. | |
| 7,656,103 B2 | 2/2010 | Shteynberg et al. | |
| 7,719,246 B2 | 5/2010 | Melanson | |
| 7,728,530 B2 | 6/2010 | Wang et al. | |
| 7,733,678 B1 | 6/2010 | Notohamiprodjo et al. | |
| 7,759,881 B1 | 7/2010 | Melanson | |
| 7,786,711 B2 | 8/2010 | Wei et al. | |
| 7,872,427 B2 | 1/2011 | Scianna | |
| 7,969,430 B2 * | 6/2011 | Korcharz | H05B 33/0893 315/246 |
| 8,102,167 B2 | 1/2012 | Irissou et al. | |
| 8,115,419 B2 | 2/2012 | Given et al. | |
| 8,169,154 B2 | 5/2012 | Thompson et al. | |
| 8,212,491 B2 | 7/2012 | Kost | |
| 8,212,492 B2 | 7/2012 | Lam et al. | |
| 8,222,832 B2 | 7/2012 | Zheng et al. | |
| 8,482,220 B2 | 7/2013 | Melanson | |
| 8,487,546 B2 | 7/2013 | Melanson | |
| 8,508,147 B2 | 8/2013 | Shen | |
| 8,536,794 B2 | 9/2013 | Melanson et al. | |
| 8,536,799 B1 | 9/2013 | Grisamore et al. | |
| 8,547,034 B2 | 10/2013 | Melanson et al. | |
| 8,569,972 B2 | 10/2013 | Melanson | |
| 8,610,364 B2 | 12/2013 | Melanson et al. | |
| 8,610,365 B2 | 12/2013 | King et al. | |
| 8,664,885 B2 | 3/2014 | Koolen et al. | |
| 8,716,957 B2 | 5/2014 | Melanson et al. | |
| 8,749,173 B1 | 6/2014 | Melanson et al. | |
| 8,847,515 B2 | 9/2014 | King et al. | |
| 2002/0140371 A1 | 10/2002 | Chou et al. | |
| 2004/0105283 A1 | 6/2004 | Schie et al. | |
| 2004/0164685 A1 * | 8/2004 | Dygert | H05B 33/0815 315/224 |
| 2004/0212321 A1 | 10/2004 | Lys | |
| 2006/0022648 A1 | 2/2006 | Ben-Yaakov et al. | |
| 2006/0208669 A1 * | 9/2006 | Huynh et al. | 315/312 |
| 2006/0214603 A1 * | 9/2006 | Oh | H05B 33/0815 315/246 |
| 2007/0182338 A1 * | 8/2007 | Shteynberg | H05B 33/0815 315/200 R |
| 2007/0182347 A1 | 8/2007 | Shteynberg | |
| 2008/0018261 A1 | 1/2008 | Kastner | |
| 2008/0030143 A1 * | 2/2008 | Goriki | H02M 7/48 315/209 R |
| 2008/0037303 A1 | 2/2008 | Mishimagi | |
| 2008/0101098 A1 | 5/2008 | Disney | |
| 2008/0143266 A1 * | 6/2008 | Langer | 315/185 R |
| 2008/0192509 A1 | 8/2008 | Dhuyvetter et al. | |
| 2008/0205103 A1 | 8/2008 | Sutardja et al. | |
| 2008/0224629 A1 | 9/2008 | Melanson | |
| 2008/0224633 A1 | 9/2008 | Melanson | |
| 2008/0224636 A1 | 9/2008 | Melanson | |
| 2009/0134817 A1 | 5/2009 | Jurngwirth et al. | |
| 2009/0135632 A1 | 5/2009 | Sohma | |
| 2009/0160369 A1 * | 6/2009 | Godbole | H05B 33/0815 315/307 |
| 2009/0167203 A1 * | 7/2009 | Dahlman | H05B 33/0818 315/291 |
| 2009/0195186 A1 | 8/2009 | Guest et al. | |
| 2009/0284182 A1 | 11/2009 | Cencur | |
| 2010/0002480 A1 | 1/2010 | Huynh et al. | |
| 2010/0013405 A1 | 1/2010 | Thompson | |
| 2010/0013409 A1 | 1/2010 | Quek et al. | |
| 2010/0066328 A1 | 3/2010 | Shimizu et al. | |
| 2010/0164406 A1 | 7/2010 | Kost et al. | |
| 2010/0213859 A1 * | 8/2010 | Shteynberg et al. | 315/224 |
| 2010/0231136 A1 | 9/2010 | Reisenauer et al. | |
| 2010/0244726 A1 | 9/2010 | Melanson | |
| 2011/0002069 A1 * | 1/2011 | Yamano | H05B 33/0812 361/18 |
| 2011/0043133 A1 * | 2/2011 | Van Laanen | H02M 1/4225 315/294 |
| 2011/0068712 A1 * | 3/2011 | Young | H05B 33/0815 315/307 |
| 2011/0080105 A1 * | 4/2011 | Mayer | H05B 37/02 315/250 |
| 2011/0080110 A1 | 4/2011 | Nuhfer et al. | |
| 2011/0084622 A1 | 4/2011 | Barrow et al. | |
| 2011/0084623 A1 | 4/2011 | Barrow | |
| 2011/0109230 A1 * | 5/2011 | Simi | H05B 33/0887 315/119 |
| 2011/0115395 A1 | 5/2011 | Barrow et al. | |
| 2011/0121754 A1 | 5/2011 | Shteynberg | |
| 2011/0148318 A1 | 6/2011 | Shackle et al. | |
| 2011/0193494 A1 * | 8/2011 | Gaknoki | H02M 1/4258 315/297 |
| 2011/0204797 A1 * | 8/2011 | Lin et al. | 315/161 |
| 2011/0204803 A1 | 8/2011 | Grotkowski et al. | |
| 2011/0234115 A1 | 9/2011 | Shimizu et al. | |
| 2011/0241557 A1 * | 10/2011 | Grotkowski | H05B 33/0851 315/246 |
| 2011/0266968 A1 | 11/2011 | Bordin et al. | |
| 2011/0291583 A1 | 12/2011 | Shen | |
| 2011/0309759 A1 | 12/2011 | Shteynberg et al. | |
| 2012/0026761 A1 * | 2/2012 | Young | H02M 7/125 363/44 |
| 2012/0049752 A1 | 3/2012 | King et al. | |
| 2012/0068626 A1 * | 3/2012 | Lekatsas et al. | 315/307 |
| 2012/0098454 A1 | 4/2012 | Grotkowski et al. | |
| 2012/0133291 A1 | 5/2012 | Kitagawa et al. | |
| 2012/0286686 A1 | 11/2012 | Watanabe et al. | |
| 2013/0015768 A1 | 1/2013 | Roberts et al. | |

(56) References Cited

U.S. PATENT DOCUMENTS

| | | |
|---|---|---|
| 2013/0154495 A1 | 6/2013 | He |
| 2014/0009082 A1 | 1/2014 | King et al. |

FOREIGN PATENT DOCUMENTS

| | | |
|---|---|---|
| CN | 1748446 A | 3/2006 |
| CN | 1843061 A1 | 10/2006 |
| CN | 101193474 A | 6/2008 |
| CN | 101505568 A | 8/2009 |
| CN | 101707874 A | 5/2010 |
| CN | 101790269 A | 7/2010 |
| CN | 101835314 | 9/2010 |
| CN | 101926222 | 12/2010 |
| EP | 1164819 | 12/2001 |
| EP | 2232949 | 9/2010 |
| EP | 2257124 A1 | 12/2010 |
| JP | 2008053181 A | 3/2008 |
| JP | 2009170240 A | 7/2009 |
| WO | 9917591 | 4/1999 |
| WO | 02096162 A1 | 11/2002 |
| WO | WO02096162 A1 | 11/2002 |
| WO | 2006079937 | 8/2006 |
| WO | 2008029108 | 3/2008 |
| WO | 2008112822 A2 | 9/2008 |
| WO | 2010011971 A1 | 1/2010 |
| WO | WO2010011971 A1 | 1/2010 |
| WO | 2010027493 A2 | 3/2010 |
| WO | 2010035155 A2 | 4/2010 |
| WO | 2011008635 A1 | 1/2011 |
| WO | 2011050453 A1 | 5/2011 |
| WO | 2011056068 A2 | 5/2011 |
| WO | 2012016197 A1 | 2/2012 |

OTHER PUBLICATIONS

AZOTEQ, IQS17 Family, IQ Switch -ProxSense Series, Touch Sensor, Load Control and User Interface, IQS17 Datasheet V2.00. doc, Jan. 2007, pp. 1-51, Azoteq (Pty) Ltd., Paarl, Western Cape, Republic of South Africa.

Chan, Samuel, et al, Design and Implementation of Dimmable Electronic Ballast Based on Integrated Inductor, IEEE Transactions on Power Electronics, vol. 22, No. 1, Jan. 2007, pp. 291-300, Dept. of Electron. Eng., City Univ. of Hong Kong.

Rand, Dustin, et al, Issues, Models and Solutions for Triac Modulated Phase Dimming of LED Lamps, Power Electronics Specialists Conference, 2007. PESC 2007. IEEE, Jun. 17-21, 2007, pp. 1398-1404, Boston, MA, USA.

Gonthier, Laurent, et al, EN55015 Compliant 500W Dimmer with Low-Losses Symmetrical Switches, ST Microelectronics, Power Electronics and Applications, 2005 European Conference, pp. 1-9, Aug. 7, 2006, Dresden.

Green, Peter, A Ballast That Can Be Dimmed from a Domestic (Phase Cut) Dimmer, International Rectifier, IRPLCFL3 rev.b, pp. 1-12, Aug. 15, 2003, El Segundo, California, USA.

Hausman, Don, Real-Time Illumination Stability Systems for Trailing-Edge (Reverse Phase Control) Dimmers, Lutron RTISS, Lutron Electronics Co, Dec. 2004, pp. 1-4, Coopersburg, PA, USA.

Lee, Stephen, et al, A Novel Electrode Power Profiler for Dimmable Ballasts Using DC Link Voltage and Switching Frequency Controls, IEEE Transactions on Power Electronics, vol. 19, No. 3, May 2004, pp. 847-833, City University of Hong Kong.

Engdahl, Tomi, Light Dimmer Circuits, 1997-2000, www.epanorama.net.

O'Rourke, Conan, et al, Dimming Electronic Ballasts, National Lighting Product Information Program, Specifier Reports, vol. 7, No. 3, Oct. 1999, pp. 1-24, Troy, NY, USA.

Supertex Inc, 56W Off-line LED Driver, 120VAC with PFC, 160V, 350mA Load, Dimmer Switch Compatible, DN-H05, pp. 1-20, Jun. 17, 2008, Sunnyvale, California, USA.

Why Different Dimming Ranges, http://www.lutron.com/TechnicalDocumentLibrary/LutronBallastpg3.pdf.

Wu, Tsai-Fu, et al, Single-Stage Electronic Ballast with Dimming Feature and Unity Power Factor, IEEE Transactions on Power Electronics, vol. 13, No. 3, May 1998, pp. 586-597.

International Search Report and Written Opinion issued in the corresponding PCT Application No. PCT/US2011/059447 and mailed on Sep. 5, 2012.

First Office Action dated Apr. 3, 2015, mailed in Application No. 2011800534817, The State Intellectual Property Office of the People's Republic of China, pp. 1-4.

Search Report dated Mar. 25, 2015, Application No. 2011800534817, The State Intellectual Property Office of the People's Republic of China, pp. 1-2.

Response to the Written Opinion as filed Mar. 27, 2014, Application No. 11794271.4, European Patent Office, pp. 1-16.

Amanci, et al, "Synchronization System with Zero-Crossing Peak Detection Algorithm for Power System Applications", The 2010 International Power Electronics Conference, pp. 2984-2991, Toronto, Ontario, Canada.

Patterson, James, "Efficient Method for Interfacing Triac Dimmers and LEDs", National Semiconductor Corp., pp. 29-32, Jun. 23, 2011, USA.

Vainio, Olli, "Digital Filtering for Robust 50/60 Hz Zero-Crossing Detectors", IEEE Transactions on Instrumentation and Measurement, vol. 45, No. 2, pp. 426-430, Apr. 1996, University of Santa Barbara, California, USA.

Non-Final Office Action dated Aug. 18, 2014, mailed in U.S. Appl. No. 13/289,845, pp. 1-43 (see particularly pp. 2-4, which cite the Present Application in a judicially created provisional double patenting rejection).

Response to Non-Final Office Action dated Aug. 18, 2014, as filed in U.S. Appl. No. 13/289,845 on Nov. 18, 2014, pp. 1-5.

Supertex, Inc., HV9931 Unity Power Factor LED Lamp Driver, pp. 1-7, 2005, Sunnyvale, California, USA. (Per MPEP 609.04(a), Applicant points out that the year of publication is sufficiently earlier than the effective U.S. filing date and any foreign priority date so that the particular month of publication is not in issue.).

* cited by examiner

CONTROLLED POWER DISSIPATION IN A LIGHTING SYSTEM

CROSS-REFERENCE TO RELATED APPLICATION

This application claims the benefit under 35 U.S.C. §119 (e) and 37 C.F.R. §1.78 of U.S. Provisional Application No. 61/410,168, filed on Nov. 4, 2010, and is incorporated by reference in its entirety.

BACKGROUND OF THE INVENTION

1. Field of the Invention

The present invention relates in general to the field of electronics, and more specifically to a method and system for controlling power dissipation in a lighting system.

2. Description of the Related Art

Switching power converters convert power received from a power source, such as a voltage supply, into power suitable for a load. The power received from the voltage supply is referred to as "POWER IN", and the power provided to the load is referred to as "POWER OUT". All switching power converters have some inherent power losses due to, for example, non-ideal component characteristics. Such inherent power losses tend to be minimized so as to increase the efficiency of the switching power converters. Inherent power losses are represented herein by "$P_{INH}$". In some contexts the amount of power supplied to the switching power converter can exceed the amount of power provided by the switching power converter to a load, i.e. POWER IN>POWER OUT+$P_{INH}$. When the POWER IN is greater than the POWER OUT+$P_{INH}$, the switching power converter passively dissipates the excess energy using passive resistors.

A dimmable lighting system that includes a low power lamp, such as one or more light emitting diodes (LEDs), represents one context when the POWER IN to the switching power converter can be greater than the POWER OUT $P_{INH}$ of the switching power converter. In this exemplary context, the switching power converter receives current through a triode for alternating current ("triac") based dimmer. Once a triac-based dimmer begins conducting during a cycle of an alternating current ("AC") supply voltage to prevent the triac from disadvantageously, prematurely disconnecting during mid-cycle of the supply voltage, the switching power converter draws a minimum current referred to as a "hold current". As long as an input current to the switching power converter is greater than or equal to the hold current, the triac-based dimmer should not prematurely disconnect. For a leading edge dimmer, a premature disconnect occurs when the dimmer begins conducting and stops conducting prior to reaching a zero crossing of the supply voltage. Premature disconnects can cause problems with the lighting system, such as flicker and instability.

Thus, to prevent premature disconnection of the triac-based dimmer, the minimum POWER IN to the switching power converter equals the hold current ("$i_{HOLD}$") times an input voltage "$V_{IN}$" to the switching power converter. Conventional triac-based dimmers were designed to provide power to incandescent light bulbs. For desired dimming levels, an incandescent light bulb generally draws a current at least equal to the hold current for all usable dimming levels. However, other lamps, such as LEDs are more efficient than incandescent light bulbs in terms of power versus light output and, thus, provide equivalent light output while using less power than an incandescent light bulb. Thus, lighting systems with LEDs typically utilize less power and less current than incandescent bulbs. To balance the power when the lighting system draws more POWER IN than the lighting system inherently dissipates and provides as POWER OUT to the lamp, the lighting system utilizes one or more passive resistors to internally dissipate excess power.

FIG. 1 depicts a lighting system 100 that includes a leading edge, phase-cut dimmer 102. FIG. 2 depicts ideal, exemplary voltage graphs 200 associated with the lighting system 100. Referring to FIGS. 1 and 2, the lighting system 100 receives an AC supply voltage $V_{IN}$ from voltage supply 104. The supply voltage $V_{IN}$, indicated by voltage waveform 202, is, for example, a nominally 60 Hz/110 V line voltage in the United States of America or a nominally 50 Hz/220 V line voltage in Europe. A leading edge dimmer 102 phase cuts leading edges, such as leading edges 204 and 206, of each half cycle of supply voltage $V_{IN}$. Since each half cycle of supply voltage $V_{IN}$ is 180 degrees of the input supply voltage $V_{IN}$, the leading edge dimmer 102 phase cuts the supply voltage $V_{IN}$ at an angle greater than 0 degrees and less than 180 degrees. Generally, the voltage phase cutting range of a leading edge dimmer 102 is 10 degrees to 170 degrees. "Phase cutting" the supply voltage refers to modulating a leading edge phase angle of each cycle of an alternating current ("AC") supply voltage. "Phase cutting" of the supply voltage is also commonly referred to as "chopping". Phase cutting the supply voltage reduces the average power supplied to a load, such as a lighting system, and thereby controls the energy provided to the load.

The input signal voltage $V_{\phi\_IN}$ to the lighting system 100 represents a dimming level that causes the lighting system 100 to adjust power delivered to a lamp 122, and, thus, depending on the dimming level, increase or decrease the brightness of the lamp 122. Many different types of dimmers exist. In general, dimmers use a digital or analog coded dimming signal that indicates a desired dimming level. For example, the triac-based dimmer 102 phase cuts a leading edge of the AC input supply voltage $V_{IN}$. The leading edge dimmer 102 can be any type of leading edge dimmer such as a triac-based leading edge dimmer available from Lutron Electronics, Inc. of Coopersberg, Pa. ("Lutron"). A triac-based leading edge dimmer is described in the Background section of U.S. patent application Ser. No. 12/858,164, entitled Dimmer Output Emulation, filed on Aug. 17, 2010, and inventor John L. Melanson.

The phase cut dimmer 102 supplies the input voltage $V_{\phi\_IN}$ as modified by the phase cut dimmer 102 to a full bridge diode rectifier 106. The full bridge rectifier 106 supplies an AC rectified voltage $V_{\phi R\_IN}$ to the switching power converter 108. Capacitor 110 filters high frequency components from rectified voltage $V_{\phi R\_IN}$. To control the operation of switching power converter 108, controller 110 generates a control signal $CS_0$ to control conductivity of field effect transistor (FET) switch 112. The control signal $CS_0$ is a pulse width modulated signal. Control signal $CS_0$ waveform 114 represents an exemplary control signal $CS_0$. The controller 110 generates the control signal $CS_0$ with two states as shown in the waveform 114. Each pulse of control signal $CS_0$ turns switch 112 ON (i.e. conducts) represents a first state that causes the switch 112 to operate efficiently and minimize power dissipation by the switch 112. During each pulse of control signal $CS_0$, the inductor current $i_L$ increases, as shown in the exemplary inductor current waveform 115, to charge inductor 116 during a charging phase $T_C$. Diode 118 prevents current flow from link capacitor 120 into switch 112. When the pulse of control signals $CS_0$ ends, the control signal $CS_0$ is in a second state, and the inductor 116 reverses voltage polarity (commonly referred to as "flyback"). The inductor current $i_L$ decreases during the flyback phase $T_{FB}$, as shown in inductor current waveform 115. The inductor current $i_L$ boosts the link voltage across the link capacitor 120 through diode 118. When the flyback phase $T_{FB}$ ends and when the next charging phase $T_C$ begins depends on the operating mode of the switching power converter. In discontinuous conduction mode (DCM), the flyback phase $T_{FB}$ ends before the next charging phase $T_C$ begins. However, regardless of whether the switching power converter 108 operates in discontinuous conduction mode, continuous conduction mode, or critical conduction mode, the flyback phase $T_{FB}$ begins as soon as the charging phase $T_C$ ends.

The switching power converter 108 is a boost-type converter, and, thus, the link voltage $V_{LINK}$ is greater than the rectified input voltage $V_{\phi R\_IN}$. Controller 110 senses the rectified input voltage $V_{\phi R\_IN}$ at node 124 and senses the link voltage $V_{LINK}$ at node 126. Controller 110 operates the switching power converter 108 to maintain an approximately constant link voltage $V_{LINK}$ for lamp 122, provide power factor correction, and correlate the link current $i_{LINK}$ with the phase cut angle of the rectified input voltage $V_{\phi R\_IN}$. Lamp 132 includes one or more light emitting diodes.

FIG. 3 depicts an exemplary light output/power graph 300 that compares light output per watt of power for an exemplary incandescent bulb and an exemplary light emitting diode (LED). Per watt of power, LEDs provide more light output than incandescent light bulbs. The low power usage by LEDs correlates to a relatively low operating current compared to the operating current for an incandescent light bulb. Since the light output of LEDs is approximately linear with power and LEDs operate at an approximately constant voltage, operating current for an LED decreases approximately linearly with decreasing light output and power.

Referring to FIGS. 1, 2, and 3, to decrease the light output of the lamp 122, the phase cut dimmer 102 increases the phase cut angle of the rectified input voltage $V_{\phi R\_IN}$, i.e. time $T_{OFF}$ increases and time $T_{ON}$ decreases. The controller 110 responds to the increased phase cut angle by decreasing the current $i_{LINK}$ provided to the lamp 122, which decreases the light output of the lamp 122.

The switching power converter 108 includes a power dissipation resistor 128 so that the dimmer current $i_{DIM}$ does not fall below the hold current value and prematurely disconnect during a cycle of the rectified input voltage $V_{\phi R\_IN}$. The "POWER IN" supplied to the switching power converter 108 equals $V_{\phi\_IN} \cdot i_{DIM}$. The "POWER OUT" supplied by switching power converter 108 equals $V_{LINK} \cdot i_{LINK}$. Because of the relatively low power requirements of an LED based lamp 122, particularly at low light output levels, if the POWER IN equals the POWER OUT+$P_{INH}$, the dimmer current $i_{DIM}$ may fall below the hold current value and cause the phase-cut dimmer 102 to prematurely disconnect. In this situation, to prevent the dimmer current $i_{DIM}$ from falling below the hold current value, the controller 110 causes the switching power converter 108 to maintain the dimmer current $i_{DIM}$ above the hold current value, which causes the POWER IN to be greater than the POWER OUT+$P_{INH}$. Since the POWER IN is greater than the POWER OUT+$P_{INH}$, the switching power converter 108 dissipates the excess power through power dissipation resistor 128.

Because of component non-idealities, the switching power converter 108 includes inherent power losses. Inherent power losses include conductor resistances and switching losses in switch 112. However, circuits are generally designed to minimize inherent power losses, and these inherent power losses are often negligible and, thus, insufficient to dissipate enough power to compensate for the difference between the POWER IN and the POWER OUT+$P_{INH}$ at some POWER OUT levels. To increase the power loss of switching power converter so that the dimmer current $i_{DIM}$ remains above a hold current value even at lower power demand by the lamp 122, switching power converter 108 includes the resistor 128 to create a passive power loss when switch 112 conducts the inductor current $i_L$. For negligible inherent power losses, the resistance value of the resistor 128 is selected so that when the switching power converter is providing a minimum link current $i_{LINK}$, the POWER IN=POWER OUT+$P_{INH}$+PASSIVE POWER DISSIPATE.

Resistor 128 is relatively cheap to implement as part of switching power converter 108. However, when the link current $i_{LINK}$ is sufficiently high such that POWER IN equals POWER OUT+$P_{INH}$, the dimmer input current $i_{DIM}$ could be maintained above the hold current value without dissipating power through resistor 128. However, since the dimmer input current $i_{DIM}$ always flows through the resistor 128 when the switch 108 is conducts, the resistor 128 still passively dissipates power regardless of whether the POWER IN is equal to the POWER OUT+$P_{INH}$, which decreases the efficiency of lighting system 100.

SUMMARY OF THE INVENTION

In one embodiment of the present invention, an apparatus includes a controller configured to control a flyback switch coupled to a primary-side transformer coil in an output stage of a switching power converter in a phase cut compatible, dimmable lighting system. The controller is further configured to control a power dissipation circuit to dissipate excess energy through the flyback switch during a controlled power dissipation phase. The controlled power dissipation phase occurs after a charging phase begins and before an end of a subsequent flyback phase of the switching power converter.

In another embodiment of the present invention, an apparatus includes a controller configured to control a flyback switch coupled to a primary-side transformer coil in an output stage of a switching power converter in a phase cut compatible, dimmable lighting system. The controller is further configured to control the flyback switch in an efficient mode and a power dissipation mode. In the efficient mode, the controller is configured to operate the flyback switch to minimize power dissipation in the flyback switch. In the power dissipation mode the controller is configured to operate the flyback switch to increase dissipation of energy in the flyback switch relative to any power dissipation in the flyback switch during operation in the efficient mode.

In a further embodiment of the present invention, a method includes controlling a flyback switch coupled to a primary-side transformer coil in an output stage of a switching power converter in a phase cut compatible, dimmable lighting system. The method further includes controlling a power dissipation circuit to dissipate excess energy through the flyback switch during a controlled power dissipation phase. The controlled power dissipation phase occurs after a charging phase begins and before an end of a subsequent flyback phase of the switching power converter.

In another embodiment of the present invention, a method includes controlling a flyback switch coupled to a primary-side transformer coil in an output stage of a switching power converter in a phase cut compatible, dimmable lighting system. The method further includes controlling the flyback switch in an efficient mode and a power dissipation mode.

Controlling the flyback switch in the efficient mode includes operating the flyback switch to minimize power dissipation in the flyback switch. Controlling the flyback switch in the power dissipation mode includes operating the flyback switch to increase dissipation of energy in the flyback switch relative to any power dissipation in the flyback switch during operation in the efficient mode.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
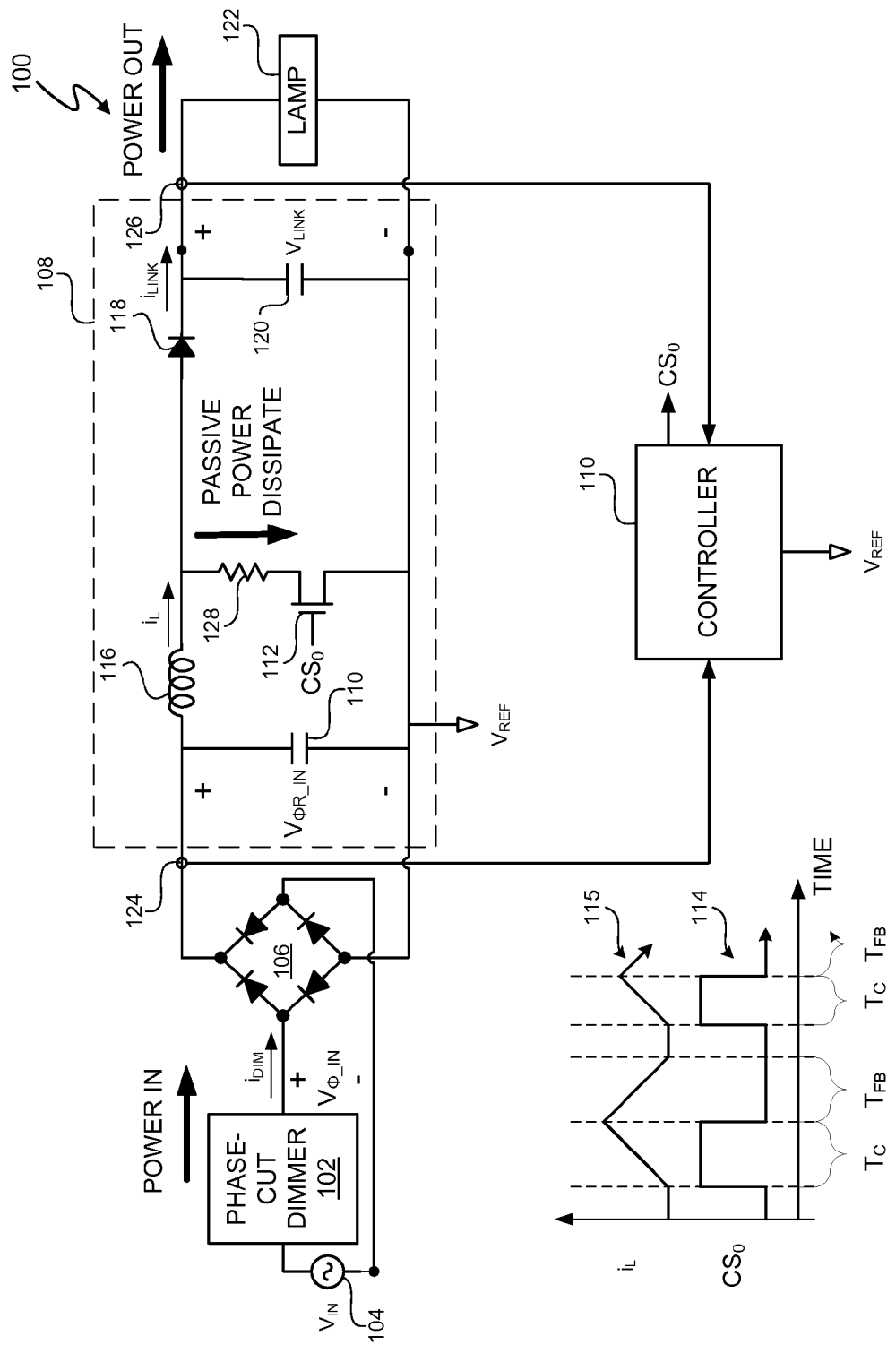
FIG. 1 (labeled prior art) depicts a lighting system that includes a leading edge dimmer.
Figure 2:
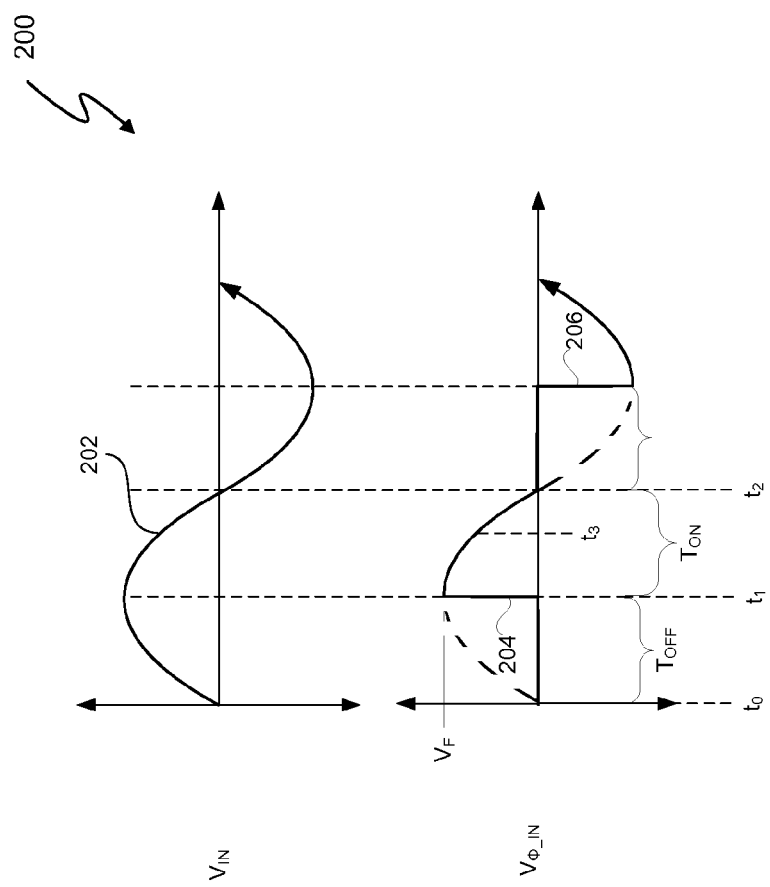
FIG. 2 (labeled prior art) depicts exemplary voltage graphs associated with the lighting system of FIG. 1.
Figure 3:
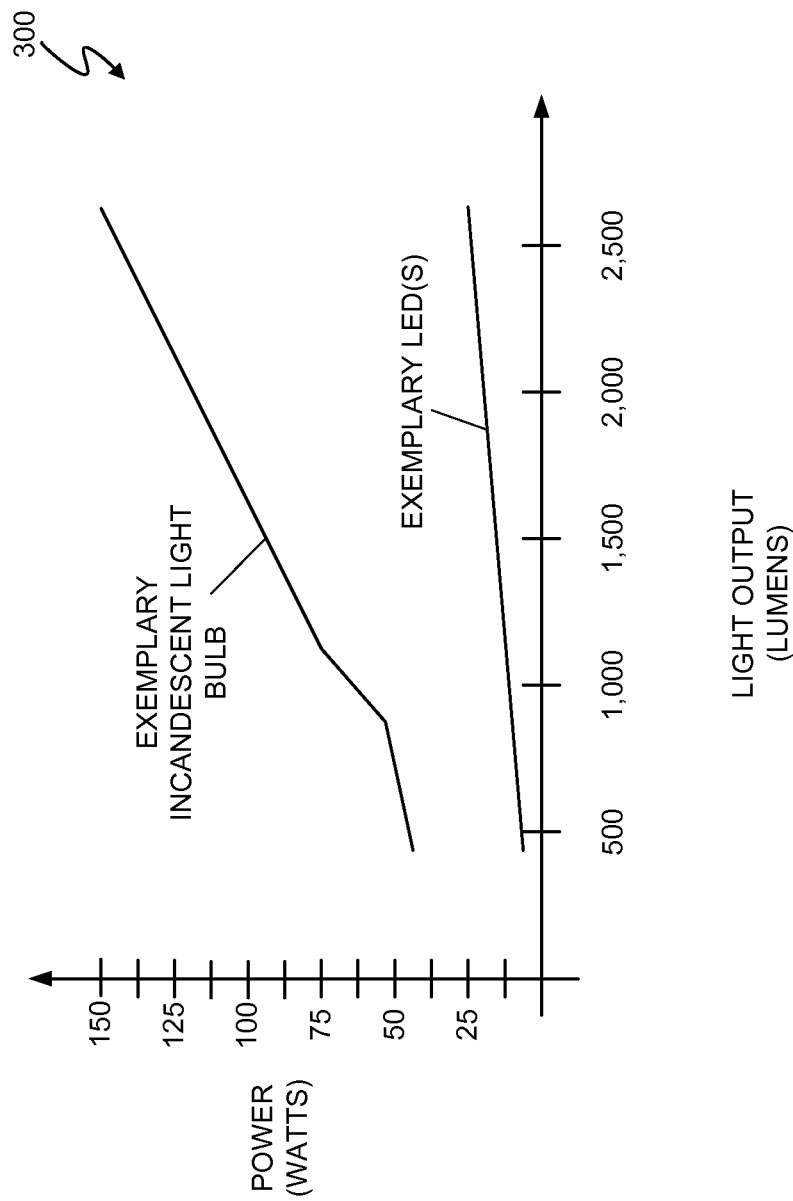
FIG. 3 (labeled prior art) depicts power versus light output for exemplary incandescent bulbs and light emitting diodes.

A lighting system includes one or more methods and systems to control dissipation of excess power in the lighting system when the power into a switching power converter from a leading edge, phase-cut dimmer is greater than the power out of the switching power converter. In at least one embodiment, the lighting system includes a controller that controls dissipation of excess energy in the lighting system to prevent a premature disconnection of the phase-cut dimmer. In at least one embodiment, the controller actively controls power dissipation by generating one or more signals to actively and selectively control power dissipation in the lighting system. By actively and selectively controlling power dissipation in the lighting system, the controller intentionally dissipates power when the power into the lighting system should be greater than the power out to a lamp of the lighting system. However, when the 'power in' can equal the 'power out' plus any inherent power losses without causing the phase-cut dimmer to prematurely disconnect, the controller causes the lighting system to operate more efficiently by reducing or eliminating intentional power dissipation in the lighting system.

To control dissipation of the excess energy, the controller controls one or more power dissipation circuits during one or more controlled power dissipation phases. In at least one embodiment, the controller creates one or more intermixed and/or interspersed power dissipation phases with one or more switching power converter charging and/or flyback phases. "Intermixed" refers to mixing one or more power dissipation phases with one or more charging and/or flyback phases. "Interspersed" refers to inserting one or more power dissipation phases between one or more charging and/or flyback phases. The controlled power dissipation phase occurs after a charging phase begins and before an end of a subsequent flyback phase of the switching power converter. In at least one embodiment, for a boost switching power converter, the charging phase is a phase when an inductor current of the switching power converter is increasing and charging a boost inductor of the switching power converter. The flyback phase is when the inductor current decreases and boosts a link voltage of the switching power converter.

In at least one embodiment, the lighting system includes one, some, or all of a switch path, link path, and flyback path power dissipation circuits to actively and selectively control power dissipation of excess energy in a switching power converter of the lighting system. The switch path power dissipation circuit dissipates power through a switch path in the switching power converter of the lighting system. In at least one embodiment, a controller is configured to control a boost switch in a switching power converter of a phase cut compatible, dimmable lighting system. The controller is configured to control the boost switch in an efficient mode and a power dissipation mode. In the efficient mode, the controller is configured to operate the boost switch to minimize power dissipation in the boost switch, and in the power dissipation mode the controller is configured to operate the boost switch to increase dissipation of energy in the boost switch relative to any power dissipation in the boost switch during operation in the efficient mode. In at least one embodiment, the switch path includes a current source to limit an inductor current through the boost switch. Limiting the inductor current through the boost switch causes the current source and/or the boost switch to dissipate power.

In at least one embodiment, the lighting system controls one or more of the timing, sequencing, and/or magnitude of the current through the boost switch, or any combination thereof, to control power dissipation by the lighting system. In at least one embodiment, controlling the timing of the current refers to a duration of time in which the current is limited or restricted. In at least one embodiment, controlling the sequencing of the current through the boost switch refers to selecting which charging and flyback phase time frames and or cycles of an input voltage to a switching power converter to control power dissipation in the lighting system. In at least one embodiment, each charging and flyback time frame occurs between when a first charging phase following an immediately preceding flyback phase begins and a flyback phase immediately preceding a next charging phase ends. In at least one embodiment, the sequence of cycles is a consecutive series of cycles, and, in at least one embodiment, the sequence of time frames or cycles is a non-consecutive series of time frames or cycles. In at least one embodiment, controlling the magnitude of the current includes controlling the internal resistance of the boost switch and/or controlling one or more current limits on the current through the boost switch.

The flyback path power dissipation circuit dissipates power through a flyback path of the switching power converter. In at least one embodiment, the lighting system controls power dissipation through a flyback path by controlling a transformer primary current in the flyback path and, for example, limiting the primary current with a current source and dissipating power in the current source. In at least one embodiment, the flyback path power dissipation circuit includes a flyback switch to limit the flyback current in the flyback switch. In at least one embodiment, the flyback path includes a current source to limit the flyback current. Limiting the flyback current through the flyback switch causes the current source and/or the flyback switch to dissipate power. In at least one embodiment, the lighting system controls one or more of the timing, sequencing, and/or magnitude of the current through the flyback switch, or any combination thereof, to control power dissipation by the lighting system.

The link path power dissipation circuit dissipates power through a link path of the switching power converter by controlling a link current of the switching power converter. In at least one embodiment, the controller controls the link path power dissipation circuit to limit the link current with a current source and dissipating power in the current source. In at least one embodiment, the link path power dissipation circuit includes an output switch to limit the link current by controlling an internal resistance of the switch. In at least one embodiment, the link path includes a current source to limit the link current. Limiting the link current through the output switch causes the current source and/or the output switch to dissipate power. In at least one embodiment, the lighting system controls one or more of the timing, sequencing, and/or magnitude of the current through the output switch, or any combination thereof, to control power dissipation by the lighting system.

Figure 4:
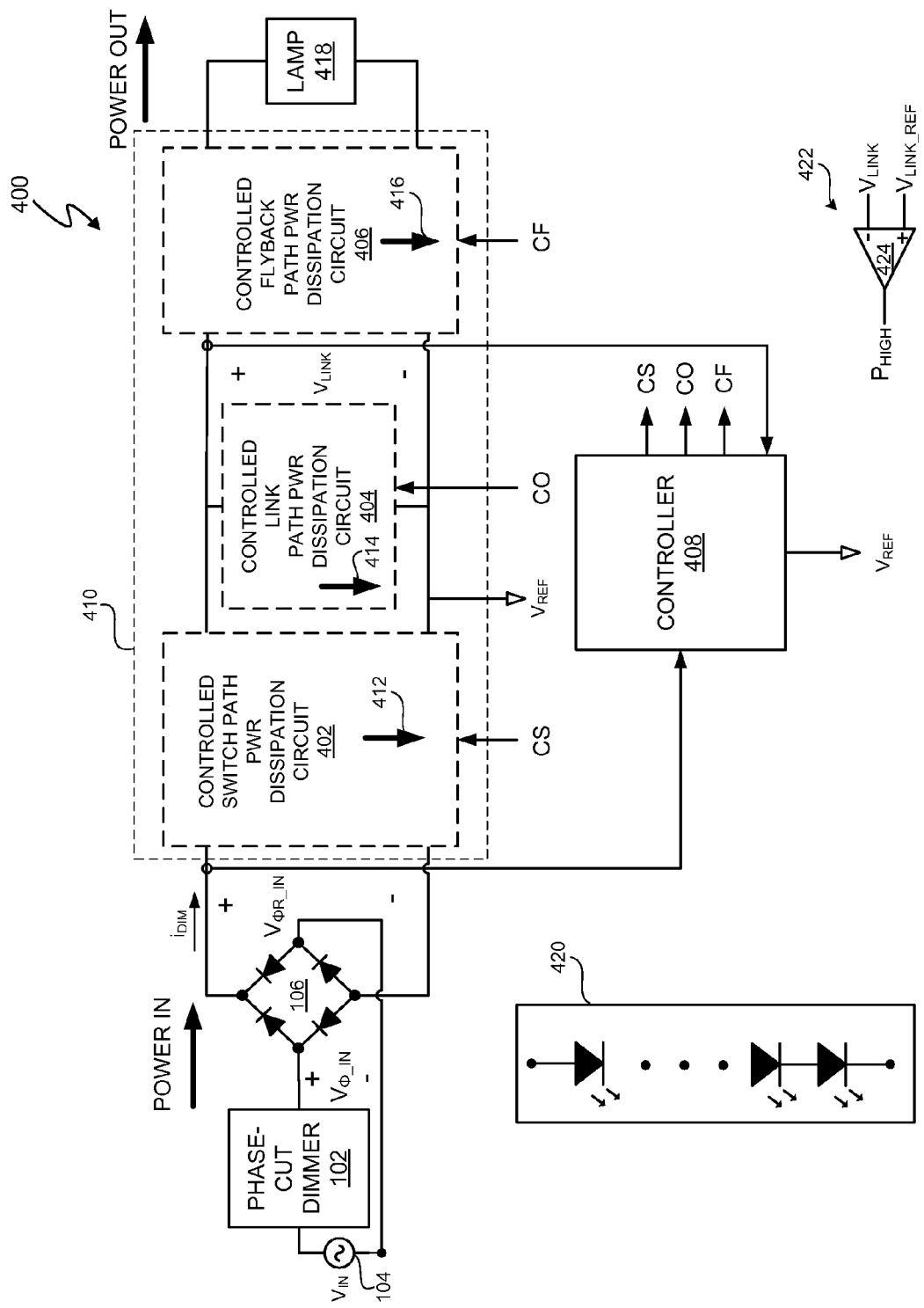
FIG. 4 depicts a lighting system that includes at least one or more power dissipation circuits.

FIG. 4 depicts a lighting system 400 that includes at least one, some, or all of a controlled switch path power dissipation circuit 402, a controlled link path power dissipation circuit 404, a controlled flyback path power dissipation circuit 406, and a controller 408 to actively and selectively control power dissipation in a switching power converter 410 of the lighting system 400. The power dissipation circuits 402, 404, and 406 are shown in dotted lines because one or two of the power dissipation circuits 402, 404, and 406 are optional. Whether to include one, two, or three of the power dissipation circuits 402, 404, and 406 and which power dissipation circuit(s) to include in lighting system 400 is a matter of design choice. Including two or three of the power dissipation circuits 402, 404, and 406 allows for distribution of power dissipation among the included power dissipation circuits. In at least one embodiment, power distribution is actively controlled by controller 408. In at least one embodiment, power distribution is fixed or preprogrammed. However, including more than one of the power distribution circuits 402, 404, and 406 can increase the complexity and cost of the switching power converter 410 and/or the complexity and cost of the controller 408. Additionally, although the power distribution circuits 402, 404, and 406 are shown as part of the switching power converter 410, in at least one embodiment, all or part of the dissipation circuits 402, 404, and 406 are located in controller 408.

As previously described, the phase-cut dimmer 102 can phase cut an input voltage $V_{IN}$ supplied by voltage supply 104. The full-bridge diode rectifier 106 rectifies the phase cut input voltage $V_{\phi\_IN}$ to generate a rectified input voltage $V_{\phi R\_IN}$. In some circumstances, especially at lower power output levels, to maintain the dimmer current $i_{DIM}$ above a hold current value the switching power converter 410 draws more POWER IN from the voltage supply 104 than the $P_{INH}$ plus the POWER OUT of the switching power converter 410. Assuming the inherent losses of the switching power converter 410 are insufficient to dissipate enough power equal to a difference between the POWER IN and the POWER OUT+$P_{INH}$, the lighting system 400 controls one or more of the power dissipation circuits 402, 404, and 406 so that the POWER IN equals POWER OUT+$P_{INH}$ plus power dissipated by one or more of the power dissipation circuits 402, 404, and/or 406. The switching power converter 410 provides power to lamp 418. In at least one embodiment, lamp 418 includes one or more light emitting diodes (LEDs), such as the series connected string of N LEDs 420. "N" represents a positive integer.

Controller 408 generates one or more respective control signals for each of the dissipation circuits 402, 404, and 406 that are included in the lighting system 400. Control signals CS, CO, and CF respectively control power dissipation in the switch path power dissipation circuit 402, link path power dissipation circuit 404, and flyback path power dissipation circuit 406. The switch path power dissipation circuit 402 dissipates power through a switch path 412 in the switching power converter 410 of the lighting system 400 in accordance with the control signal CS. The link path power dissipation circuit 404 dissipates power through a link path 414 in the switching power converter 410 in accordance with the control signal CO. The flyback path power dissipation circuit 406 dissipates power through a flyback path 416 in the switching power converter 410 in accordance with the control signal CF. The particular method and circuit(s) used to implement the power dissipation circuits 402, 404, and 406 and control dissipation of power through the switch path 412 is a matter of design choice. Additionally, controlling the timing, sequencing, and/or magnitude of power dissipation in the power dissipation circuits 402, 404, and 406 is a matter of design choice. Exemplary embodiments of the power dissipation circuits 402, 404, and 406 are subsequently described. The power dissipation circuits 402, 404, and 406 are depicted in FIG. 4 as wholly outside the controller 408. However, in at least one embodiment, all or part of one or more of the power dissipation circuits 402, 404, and 406 are included within the controller 408.

The particular implementation of controller 408 is a matter of design choice. For example, controller 408 can be (i) implemented as an integrated circuit including, for example, a processor to execute software or firmware instructions stored in a memory, (ii) implemented using discrete components, or (iii) implemented using any combination of the foregoing. In at least one embodiment, controller 408 generally regulates the link voltage as described in U.S. patent application Ser. No. 11/967,269, entitled "Power Control System Using a Nonlinear Delta-Sigma Modulator With Nonlinear Power Conversion Process Modeling", filed on Dec. 31, 2007, inventor John L. Melanson (referred to herein as "Melanson I"), U.S. patent application Ser. No. 11/967,275, entitled "Programmable Power Control System", filed on Dec. 31, 2007, and inventor John L. Melanson (referred to herein as "Melanson II"), U.S. patent application Ser. No. 12/495,457, entitled "Cascode Configured Switching Using at Least One Low Breakdown Voltage Internal, Integrated Circuit Switch to Control At Least One High Breakdown Voltage External Switch", filed on Jun. 30, 2009 ("referred to herein as "Melanson III"), and inventor John L. Melanson, and U.S. patent application Ser. No. 12,174,404, entitled "Constant Current Controller With Selectable Gain", filing date Jun. 30, 2011, and inventors John L. Melanson, Rahul Singh, and Siddharth Maru, which are all incorporated by reference in their entireties. The switching power converter 410 can be any type of switching power converter, such as a boost, buck, boost-buck, or Cúk switching power converter. Switching power converter 410 includes other components, such as an EMI capacitor, inductor, and link capacitor, which, for clarity of FIG. 4, are not shown but are subsequently described specific embodiments.

The manner of determining whether the POWER IN is greater than the $P_{INH}$+POWER OUT is a matter of design choice. In at least one embodiment, the controller 408 includes the power monitor circuit 422. When power demand by the lamp 418 increases, the link voltage $V_{LINK}$ decreases, which indicates an increase in the POWER OUT. Conversely, when power demand by the lamp 418 declines, the link voltage $V_{LINK}$ increases, which indicates a decrease in the POWER OUT. The comparator 424 of the power monitor circuit 422, thus, compares the link voltage $V_{LINK}$ with a reference link voltage $V_{LINK\_REF}$. In at least one embodiment, the reference link voltage $V_{LINK\_REF}$ is set to a voltage level that is a few volts or a few percent higher than the nominal voltage set for the lamp 418. If the link voltage $V_{LINK}$ decreases below the reference link voltage $V_{LINK\_REF}$, the output $P_{HIGH}$ of the comparator 424 is HIGH, which indicates an increase in the POWER OUT. If the link voltage $V_{LINK}$ increases above the reference link voltage $V_{LINK\_REF}$, the output $P_{HIGH}$ of the comparator 424 is LOW, which indicates a decrease in the POWER OUT. In at least one embodiment, if normal operation of the switching power converter 410 does not prevent an increase of the link voltage $V_{LINK}$ above the reference link voltage $V_{LINK\_REF}$, then the POWER IN is greater than the POWER OUT+$P_{INH}$, and controller 408 operates one or more of the power dissipation circuits 412, 414, and 416 to dissipate the excess energy represented by the difference between the POWER IN and the POWER OUTP+$P_{INH}$.

Figure 5:
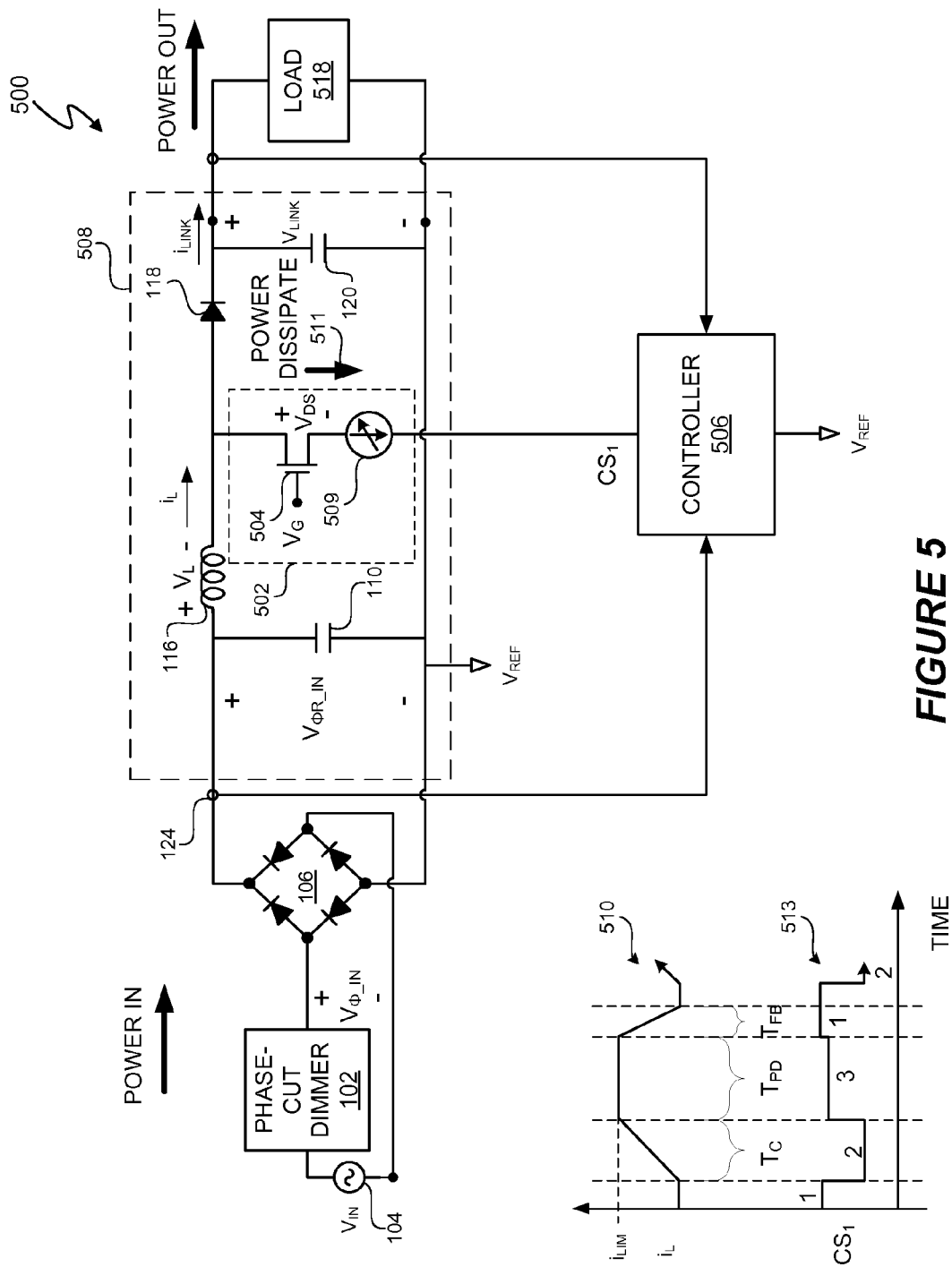
FIG. 5 depicts a lighting system that includes a switch path power dissipation circuit.

FIG. 5 depicts a lighting system 500 that represents one embodiment of lighting system 400. Lighting system 500 includes a switch path power dissipation circuit 502 to dissipate excess power in the lighting system 500. The switch path power dissipation circuit 502 represents one embodiment of the switch path power dissipation circuit 402. The particular implementation and control of the switch path power dissipation circuit 502 is a matter of design choice. The switch path power dissipation circuit 502 includes a FET boost switch 504 in a boost-type switching power converter 508 and includes a controllable current source 509. In at least one embodiment, the controller 506 actively dissipates power in the switching power converter 508 during a power dissipation phase by limiting an inductor current $i_L$ and thereby actively and selectively dissipates power in the lighting system 500. Limiting the inductor current $i_L$ through the boost switch 504 causes the current source 509 and/or the boost switch 504 to dissipate the excess power through switch path 511.

When the POWER IN is greater than the $P_{INH}$+POWER OUT to the load 518, the controller 506 controls the switch path power dissipation circuit 502 to control dissipation of the excess energy by at least the boost switch 504. Load 518 includes one or more LEDs. In at least one embodiment, a gate voltage $V_G$ biases a gate of boost switch 504 so that controller 506 controls conductivity of the boost switch 504 using a source control signal $CS_1$ as, for example, generally described in Melanson III. In other embodiments, controller 506 controls the gate voltage $V_G$ of boost switch 504 to control conductivity of the boost switch 504 as, for example, generally described in Melanson I and Melanson II. Controller 506 represents one embodiment of controller 408. In at least one embodiment, the control signal $CS_1$ controls the value of the inductor current $i_L$, as depicted by the exemplary, variable inductor current waveform 510.

The inductor current waveform 510 represents an exemplary inductor current $i_L$ waveform during controlled dissipation of energy through the boost switch 504. During a charging phase $T_C$, the controller 506 generates the control signal $CS_1$ to cause the boost switch 504 to conduct. When the boost switch 504 conducts, the inductor current $i_L$ increases. When POWER IN is greater than POWER OUT+$P_{INH}$, rather than minimizing power loss, the controller 506 intentionally limits the inductor current $i_L$, which causes dissipation of excess energy by at least the boost switch 504 during a power dissipation phase $T_{PD}$. Assuming that inherent losses in the switching power converter 508 are negligible, the "excess energy" equals the POWER IN minus the (POWER OUT+$P_{INH}$). Limiting the inductor current $i_L$ during the power dissipation phase $T_{PD}$ causes the change in the inductor current $di_L/dt$ to move toward 0. Since the voltage $V_L$ across the inductor 116 equals $L \cdot di_L/dt$, the voltage $V_L$ is directly proportional to the rate of change of the inductor current $di_L/dt$. "L" is the inductance of inductor 116. Thus, as the rate of change of the inductor current $di_L/dt$ moves toward 0, the rate of energy storage by the inductor 116 decreases toward 0 and more power is dissipated by the boost switch power dissipation circuit 502.

Referring to the control signal $CS_1$ waveform 513, in at least one embodiment, the controller 506 is configured to control the boost switch 504 in an efficient mode and a power dissipation mode. In the efficient mode, the controller 506 generates a two-state control signal $CS_1$, such as the two-states of control signal $CS_0$ (FIG. 1), to operate the boost switch 504 to minimize power dissipation in the boost switch 504. In the power dissipation mode, the controller 506 is configured to operate the boost switch 504 to increase dissipation of energy in the boost switch relative to any power dissipation in the boost switch 504 during operation in the efficient mode. In at least one embodiment, to operate the boost switch 504 in the power dissipation mode, the controller 506 generates the control signal $CS_1$ with at least three (3) states, such as states "1", "2", and "3" in the waveform 513. During states 1 and 2, the controller 506 operates the boost switch 504 in an efficient mode to minimize power dissipation by the boost switch 504. During state 3, the controller 506 operates the boost switch 504 in a power dissipation mode. In state 3, the controller 506 limits the inductor current $i_L$ and causes the control signal $CS_1$ to have a voltage that is greater than state "2" but lower than state "1". Thus, the boost switch 504 does not turn OFF completely in state 3. State 3 is not simply a transient state, i.e. a continuous transition of control signal $CS_1$ between states 1 and 2. State 3 is an intentional, non-transient state that alters power dissipation by the boost switch 504. Thus, in state 3, the controller 506 generates the control signal $CS_1$ by limiting the inductor current $i_L$ to cause a non-zero voltage $V_{DS}$ across the boost switch 504 at the same time that current $i_L$ flows through the boost switch 504. The simultaneous occurrence of the voltage $V_{DS}$ across the boost switch 504 and the current $i_L$ through the boost switch 504 causes power dissipation by the boost switch 504. The number of states is a matter of design choice and can be increased or decreased by, for example, controlling different limits of the inductor current $i_L$.

For example, in at least one embodiment, the rate of change of the inductor current $di_L/dt$ is driven by the controller 506 to approximately 0. When the change $di_L/dt$ in the inductor current $i_L$ is 0, the inductor current $i_L$ holds at a constant value, and the voltage $V_L$ across inductor 116 is approximately 0. During a charging phase, the inductor current $i_L$ increases. To dissipate power during a charging phase $T_C$, the rate of change of the inductor current $di_L/dt$ is decreased, which reduces the voltage $V_L$ across the inductor 116. As the inductor voltage $V_L$ decreases, the proportion of power dissipated by the switch path power dissipation circuit 502 increases. During a flyback phase, the rate of change of the inductor current $di_L/dt$ and the inductor voltage $V_L$ are negative. Thus, to dissipate power during a flyback phase, the rate of change of the inductor current $di_L/dt$ is increased towards 0, which increases the inductor voltage $V_L$ toward 0 and increases the proportion of power dissipated by the switch path power dissipation circuit 502.

In at least one embodiment, the current source 509 limits the inductor current to an inductor current limit value $i_{LIM}$. Thus, when a value of the inductor current $i_L$ through the boost switch 504 reaches the inductor current limit value $i_{LIM}$, $di_L/dt$ decreases with 0 or to a smaller value that a value that would otherwise occur without a power dissipation phase $T_{PD}$. The power dissipation phase $T_{PD}$ occurs after the charging phase $T_C$ and before the subsequent flyback phase $T_{FB}$ In at least one embodiment, the controller 506 intersperses the power dissipation phase $T_{PD}$ between the charging phase $T_C$ and the flyback phase $T_{FB}$ and causes the switch path power dissipation circuit 502 to dissipate energy until the flyback period $T_{FB}$ begins when the boost switch 504 is turned OFF.

In at least one embodiment, the inductor current limit value $i_{LIM}$ is controllable by the controller 506 to adjust a duration of the power dissipation period $T_{PD}$. In at least one embodiment, the source control signal $CS_1$ controls when the charging phase $T_C$ and the flyback phase $T_{FB}$ begin for each cycle of the rectified input voltage $V_{\phi R\_IN}$. In at least one embodiment, the power dissipation phase $T_{PD}$ ends when the flyback phase $T_{FB}$ begins. Thus, since controller 506 generates the source control signal $CS_1$, controller 506 controls the duration of the power dissipation phase $T_{PD}$ by controlling when to begin the flyback phase $T_{FB}$.

The controller 506 controls interspersing and/or intermixing of one or more power dissipation phases with one or more charging and/or flyback phases. In at least one embodiment, the controller 506 intersperses a power dissipation phase $T_{PD}$ between charging phases or a flyback phase by reducing the change in the inductor current $i_L$ over time, i.e. $di_L/dt$, by reducing $di_L/dt$ to zero. When $di_L/dt$ is reduced to zero, power dissipation occurs through the boost switch 504. In at least one embodiment, the controller intermixes a power dissipation phase $T_{PD}$ with a charging phase $T_C$ or a flyback phase $T_{FB}$ by reducing $di_L/dt$ to a non-zero value. When $di_L/dt$ is reduced to a non-zero value, the charging phase $T_C$ or flyback phase $T_{FB}$ continues in combination with power dissipation by the switch path power dissipation circuit 502 through the boost switch 504.

Figure 6:
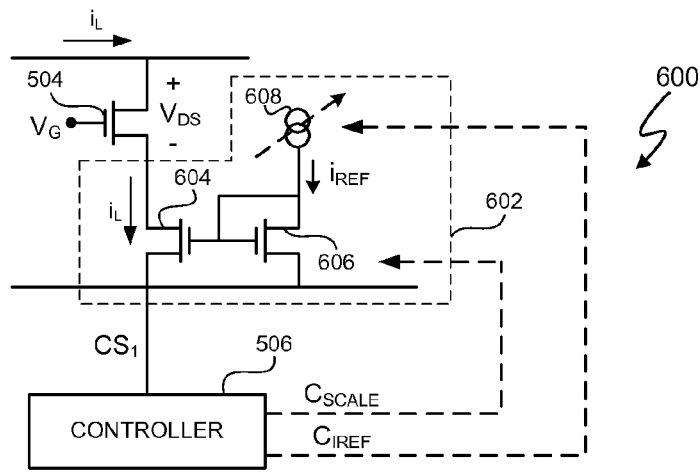
FIG. 6 depicts an embodiment of the switch path power dissipation circuit of FIG. 5.
Figure 7:
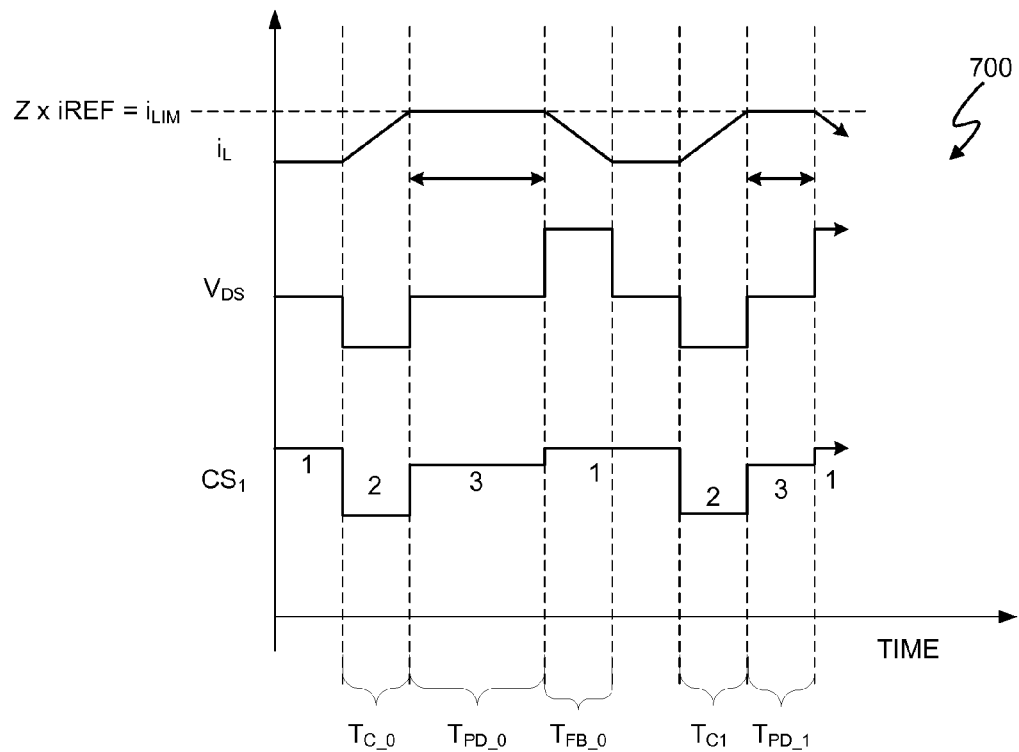
FIGS. 7 and 8 depict exemplary waveforms present during an exemplary operation of the switch power dissipation circuit of FIG. 6.

FIG. 6 depicts a switch path power dissipation circuit 600, which represents one embodiment of the switch path power dissipation circuit 502. FIG. 7 depicts exemplary waveforms 700 for an exemplary inductor current $i_L$, boost switch 504 drain-to-source voltage $V_{DS}$, and control signal $CS_1$ present during an exemplary operation of the switch power dissipation circuit 600. Referring to FIGS. 5, 6, and 7, the switch path power dissipation circuit 600 includes a controllable current source 602, which represents one embodiment of the controllable current source 509. The current source 602 includes FETs 604 and 606, which are configured as a current mirror. In at least one embodiment, the controller 506 modulates the control signal $CS_1$ to control current through switch 504 using at least three (3) states. States 1 and 2 are efficient states when power dissipation by the boost switch 504 is minimized. State 3 is an inefficient or power dissipation state when controller 506 intentionally and actively causes the boost switch 504 to dissipate power.

When controller 506 causes the source control signal $CS_1$ to become a logical 0, the boost switch 504 turns ON, and the inductor current $i_L$ begins to ramp up at the beginning of charging period $T_{C\_0}$. When the inductor current $i_L$ is ramping up, the control signal $CS_1$ is in state 2, which allows the boost switch 504 to operate efficiently, i.e. minimize internal power loss by the boost switch 504. In at least one embodiment, the boost switch 504 turns ON at state 2, and the inductor $i_L$ flows through boost switch 504 and FET 604. Current source 608 supplies a reference current $i_{REF}$, which flows through FET 606. In at least one embodiment, control signal $CS_1$ turns boost switch 504 ON in state 2 with sufficient voltage to minimize the internal resistance of boost switch 504. The size of FET 604 is scaled to the size of FET 606 by a scaling factor of Z. The value of the scaling factor Z is a positive number and a matter of design choice. The value of the scaling factor Z times the value of the reference current $i_{REF}$ sets an inductor current limit value $i_{LIM}$. Thus, when the inductor current $i_L$ reaches the inductor current limit value $i_{LIM}$, the inductor current $i_L$ will stop increasing. In at least one embodiment, when the inductor current $i_L$ reaches the inductor current limit value $i_{LIM}$, the charging phase $T_{C\_0}$ ends and a power dissipation phase $T_{PD\_0}$ begins. At the current limit $i_{LIM}$, the control signal $CS_1$ is at the non-transient state 3, and power is dissipated by the switch 504. Once the inductor current $i_L$ reaches the current limit value $i_{LIM}$, the inductor current $i_L$ becomes a constant equal to $i_{LIM}$, and boost switch 504 and FET 604 dissipate the excess energy in the switching power converter 508.

When the boost switch 504 turns OFF, the power dissipation phase $T_{PD\_0}$ ends, and the flyback phase $T_{FB\_0}$ begins. In discontinuous conduction mode (DCM) and critical conduction mode (CRM), the flyback phase $T_{FB\_0}$ continues until the inductor current $i_L$ reaches zero. In continuous conduction mode (CCM), the next charging phase $T_{C\_1}$ begins prior to the inductor current $i_L$ reaching zero. The waveforms 700 illustrate the switching power converter 508 operating in DCM. The switching power converter 508 can also operate in CCM and CRM. In at least one embodiment, when operating in DCM, once the link voltage $V_L$ drops to a predetermined value, the controller 506 generates control signal $CS_1$ to cause the boost switch 504 to conduct and initiate the next charging phase $T_{C\_1}$. When the inductor current $i_L$ reaches the inductor current limit value $i_{LIM}$, the next power dissipation phase $T_{PD\_1}$ begins and so on.

The duration of the power dissipation phases $T_{PD\_0}$, $T_{PD\_1}$, and so on is controlled by the controller 506 and are a matter of design choice. In at least one embodiment, the duration of the power dissipation phases is sufficient to dissipate all excess energy in a single cycle of the rectified input voltage $V_{\phi R\_IN}$. In at least one embodiment, the duration of the power dissipation phases is varied and sequenced to dissipate all excess energy in consecutive or non-consecutive cycles of the rectified input voltage $V_{\phi R\_IN}$.

Additionally, in at least one embodiment, current source 608 can vary the value of the reference current $i_{REF}$ in accordance with an optional current reference control signal $C_{iREF}$ generated by controller 506. Varying the value of the reference current $i_{REF}$ also varies the inductor limit current $i_{LIM}$ in accordance with the scaling factor Z. By varying the reference current $i_{REF}$ and, thus, the inductor limit current $i_{LIM}$ during a single cycle of the rectified input voltage $V_{\phi R\_IN}$, the controller 506 can stage power dissipation. The controller 506 can also vary the inductor limit current $i_{LIM}$ during consecutive or non-consecutive cycles of rectified input voltage $V_{\phi R\_IN}$ to manage power dissipation in switching power converter 508.

Additionally, in at least one embodiment, current source 608 can vary the value of the scaling factor Z in accordance with an optional scaling factor control signal $C_{SCALE}$ generated by controller 506. Varying the scaling factor Z also varies the inductor limit current $i_{LIM}$ in accordance with the scaling factor Z. By varying the scaling factor Z and, thus, the inductor limit current $i_{LIM}$ during a single cycle of the rectified input voltage $V_{\phi R\_IN}$, the controller 506 can stage power dissipation. The controller 506 can also vary the inductor limit current $i_{LIM}$ during consecutive or non-consecutive cycles of rectified input voltage $V_{\phi R\_IN}$ to manage power dissipation in switching power converter 508. In at least one embodiment, the FETs 604 and/or 606 are implemented using multiple, parallel connected FETs (not shown). In at least one embodiment, the scaling factor control signal $C_{SCALE}$ changes the number of FETs used to implement FETs 604 and/or 606 and, thus, changes the scaling factor. For example, in at least one embodiment, one FET is used to implement FET 606 and 200 FETs identical to the one FET used to implement FET 606 are used to implement FET 604, which provides a scaling factor of 200. By disabling one or more of the FETs used to implement FET 604, the controller varies the scaling factor Z. Additionally, in at least one embodiment, the controller 506 controls both the reference current $i_{REF}$ and the scaling factor $C_{SCALE}$ to control the inductor current $i_L$.

Figure 8:
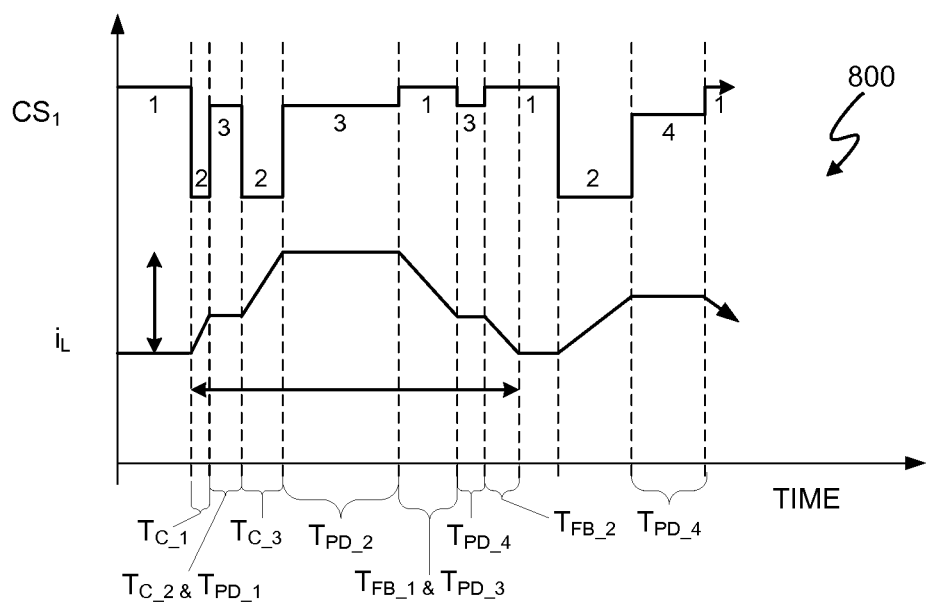

FIG. 8 depicts an exemplary inductor current $i_L$ and control signal $CS_1$ waveforms 800 for when the controller 506 causes the switch path power dissipation circuit 502 to dissipate excess power. Referring to FIGS. 5, 6, and 8, charging phases and feedback phases can be interspersed and intermixed with power dissipation phases as desired to control the timing, sequencing, and magnitude of power dissipation in the boost switch 504. The particular timing and amount of intermixing and interspersing power dissipation in the switch path power dissipation circuit 600 is a matter of design choice. The waveforms 800 represent an exemplary choice.

In at least one embodiment, the controller 506 modulates the control signal $CS_1$ to control current through switch 504 using at least four (4) states. States 1 and 2 are efficient states when the controller 506 operates the boost switch 504 in an efficient mode and, thus, minimizes power dissipation by the boost switch 504. States 3 and 4 are inefficient states when the controller 506 operates the boost switch 504 in a power dissipation mode. During states 3 and 4 in the power dissipation mode, the controller 506 intentionally and actively causes the boost switch 504 to dissipate power.

Referring to the waveforms 800 and the switch path power dissipation circuit 600, during the charging phase $T_{C\_1}$, the control signal $CS_1$ causes the boost switch 504 to saturate and the inductor current $i_L$ increases over time. At the beginning of the intermixed charging phase $T_{C\_2}$ and power dissipation phase $T_{PD\_1}$, the controller 506 generates the current reference control signal $C_{IREF}$ and/or the scaling control signal $C_{SCALE}$ to decrease the rate of increase of the inductor current $i_L$, i.e. decrease $di_L/dt$, and the control signal $CS_1$ is in state 3.

At the beginning of the third charging phase $T_{C\_3}$, the controller 506 reenters an efficient mode for boost switch 504 and increases the inductor current $i_L$ rate of change $di_L/dt$, which reduces power dissipation in the boost switch 504. In state 3, the controller 504 causes the boost switch 504 to operate in a power dissipation mode. The controller 506 intersperses the second power dissipation phase $T_{PD\_2}$ between the intermixed second charging phase $T_{C2}$ and first power dissipation phase $T_{PD\_1}$ by limiting the rate of change $di_L/dt$ of the inductor current $i_L$ to 0. Limiting $di_L/dt$ to 0 holds the inductor current $i_L$ constant and dissipates excess power through the boost switch 504 and in the current source 602. Controller 506 generates a control signal $CS_1$ that weakly leaves the boost switch 504 ON but allows the flyback phase $T_{FB\_1}$ to be intermixed with a third power dissipation phase $T_{PD\_3}$. During the interspersed power dissipation phase $T_{PD\_4}$, controller 506 turns the boost switch 504 OFF, and controller 506 causes the inductor current $i_L$ to be limited and $di_L/dt$ to equal zero. During the second feedback phase $T_{FB\_2}$, the controller 502 turns the boost switch 504 ON to allow the full inductor current $i_L$ to charge the link capacitor 120.

During power dissipation phase $T_{PD\_4}$, the controller 506 operates the boost switch 504 in a power dissipation mode by generating the control signal $CS_1$ in state 4. State 4 corresponds to a limiting of the inductor current $i_L$ at a lower limit than the limit associated with state 3.

Figure 9:
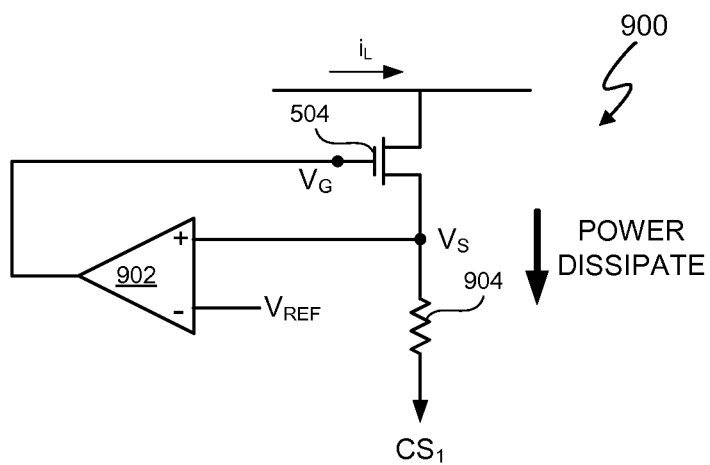
FIG. 9 depicts another embodiment of the switch path power dissipation circuit of FIG. 5.

FIG. 9 depicts switch path power dissipation circuit 900, which represents one embodiment of the switch path power dissipation circuit 502. Operational amplifier 902 provides a feedback path to control the gate voltage $V_G$ and source voltage $V_S$ of boost switch 504. The controller 506 controls the reference voltage $V_{REF}$, and the comparator 902 drives the gate voltage $V_G$ so that the source voltage $V_S$ of the boost switch 504 equals the reference voltage $V_{REF}$. The source voltage $V_S$ and the voltage level of the control signal $CS_1$ create a voltage difference across the power dissipation resistor 904, which sets the value of the inductor current $i_L$. The inductor current $i_L$ flows through the boost switch 504 and the power dissipation resistor 904. Since the controller 506 controls the source voltage $V_S$ and the voltage level of the control signal $CS_1$, controller 506 controls the value of the inductor current $i_L$. Thus, the controller 506 can control the inductor current $i_L$ and intermix and/or intersperse power dissipation phases as described in conjunction, for example, with FIGS. 7 and 8. The particular timing and amount of intermixing and interspersing of power dissipation in the switch path power dissipation circuits 502, 600, and 900 is a matter of design choice.

Figure 10:
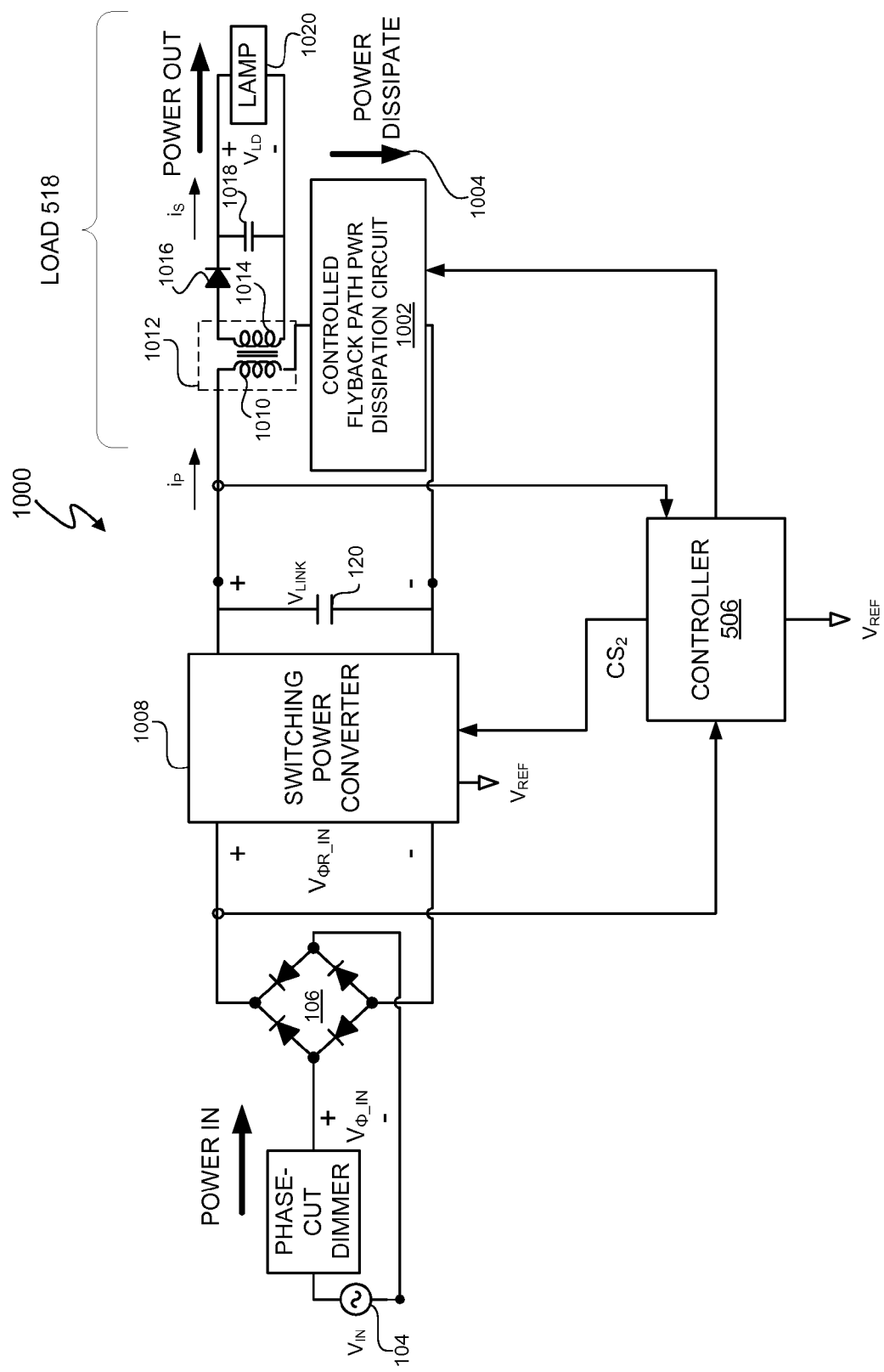
FIG. 10 depicts a lighting system that includes a flyback path power dissipation circuit.

FIG. 10 depicts a lighting system 1000, which represents one embodiment of the lighting system 400. The lighting system 1000 includes a controlled flyback path power dissipation circuit 1002, which represents one embodiment of the controlled flyback path power dissipation circuit 406. In at least one embodiment, the lighting system 1000 controls power dissipation through a flyback path 1004 by controlling a transformer primary current $i_P$ in the flyback path 1002 and limiting the primary current ip to control power dissipation.

The lighting system 1000 also includes a controller 506 that controls the flyback path power dissipation circuit 1002 and generates control signal $CS_2$ to control switching power converter 1008. In at least one embodiment, switching power converter 1008 is a boost-type switching power converter, such as switching power converter 108 (FIG. 1), and controller 506 controls the switching power converter 1008 as, for example, generally described in Melanson I and Melanson II.

In at least one embodiment, the flyback path power dissipation circuit 1002 modulates the primary current $i_P$ to energize the primary-side coil 1010 of transformer 1012. Transformer 1012 transfers energy from the primary-side coil 1010 to the secondary-side coil 1014 to cause a secondary current $i_S$ to flow through diode 1016 and charge load voltage capacitor 1018 to the load voltage $V_{LD}$. The load voltage $V_{LD}$ provides a voltage across lamp 1020.

When the POWER IN is greater than the POWER OUT+ $P_{INH}$, controller 506 operates the flyback path power dissipation circuit 1002 to dissipate excess energy. The particular implementation and operation of the flyback path power dissipation circuit 1002 to dissipate the excess energy is a matter of design choice.

Figure 11:
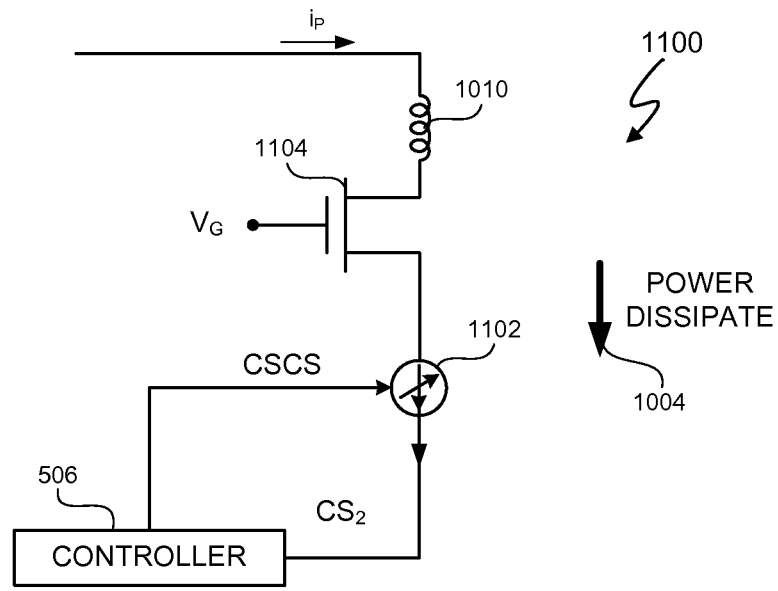
FIGS. 11 and 12 depict respectively embodiments of the flyback path power dissipation circuit of FIG. 10.

FIG. 11 depicts flyback dissipation circuit 1100, which represents one embodiment of the flyback power dissipation circuit 1002. Flyback dissipation circuit 1100 includes controllable current source 1102 to control the primary current ip through the flyback FET 1104. Controller 506 generates one or more current source control signals CSCS and control signal $CS_2$ to control the primary current through flyback switch 1104. Controlling the primary current $i_P$ allows the flyback dissipation circuit 1100 to control power dissipation in a manner similar to the control of power dissipation in the switch path power dissipation circuit 502 (FIG. 5).

Figure 12:
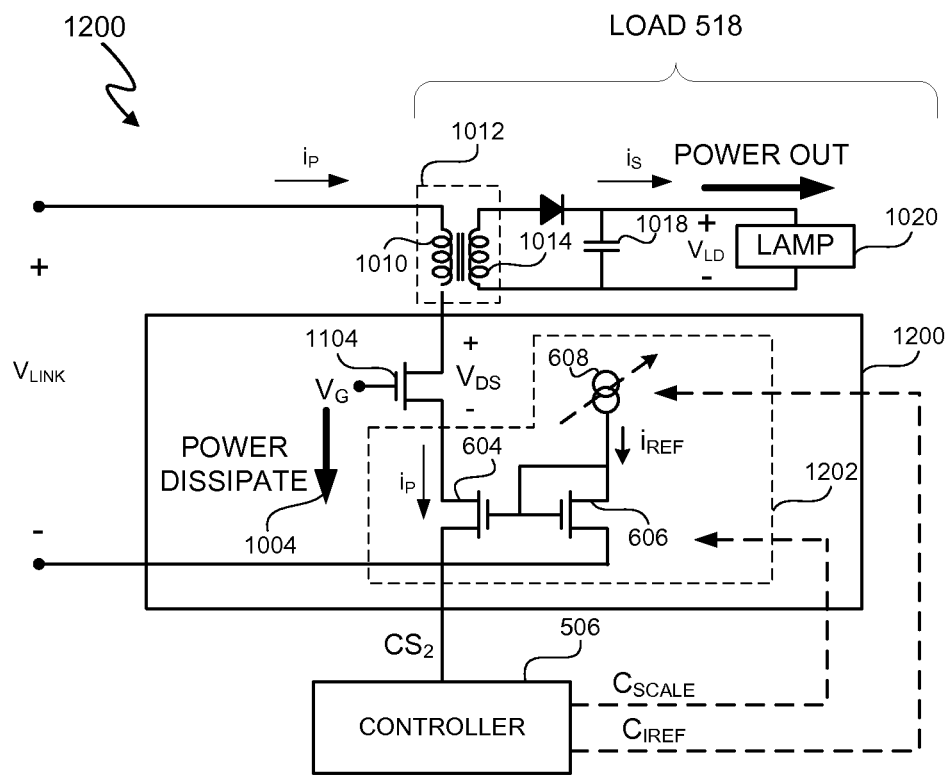

FIG. 12 depicts flyback path power dissipation circuit 1200, which represents one embodiment of flyback path power dissipation circuit 1002. In at least one embodiment, controller 506 controls power dissipation through the flyback path 1004 by controlling the transformer primary current $i_P$ and, for example, limiting the primary current $i_P$ with a current source 1202 and dissipating power in the current source 1202. In at least one embodiment, the current source 1202 is identical to the current source 602 (FIG. 6) and functions as described in conjunction with current source 602. In at least one embodiment, the current source 1202 limits the primary current $i_P$ through the flyback FET 1104 to limit the primary current $i_P$ (also referred to as a "flyback current"). Limiting the primary current ip through the flyback switch 1104 causes the current source 1202 to dissipate power. In at least one embodiment, the controller 506 controls interspersing, intermixing, and sequencing of power dissipation through the flyback switch 1104 and the current source 1202 to control power dissipation by the lighting system 1000 (FIG. 10). As with the lighting system 500, in at least one embodiment, the controller 506 generates the control signal $CS_2$ to operate flyback switch 1104 in an efficient mode when not dissipating power by the flyback switch 1104. Also, as with lighting system 500, the controller 506 generates the control signal $CS_2$ by limiting the primary current $i_P$ to operate the flyback switch 1104 in the power dissipation mode. Thus, the controller 506 generates the control signal $CS_2$ with at least three (3) states. The number of states is a matter of design choice and can be increased or decreased, for example, by controlling different limits of the primary current $i_P$.

Figure 13:
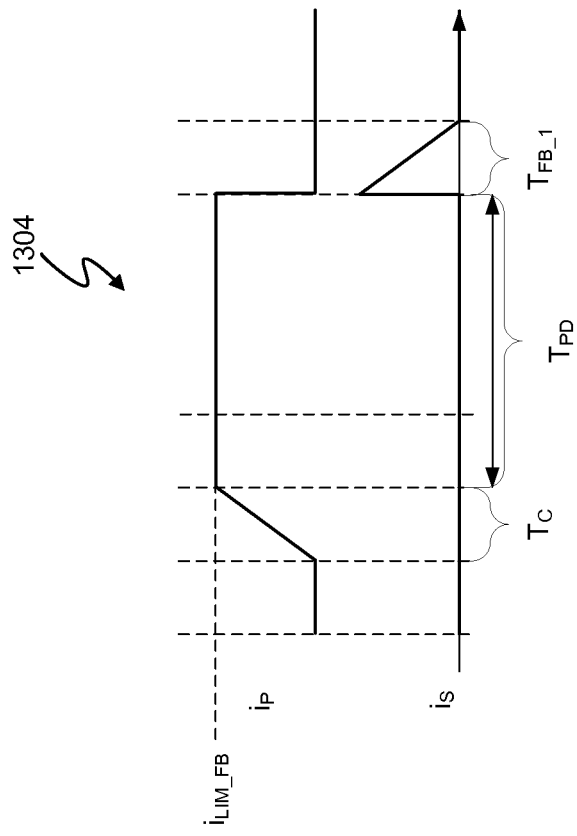
FIGS. 13 and 14 depict exemplary waveforms present during an exemplary operation of the flyback path power dissipation circuits of FIGS. 11 and 12.
Figure 13:
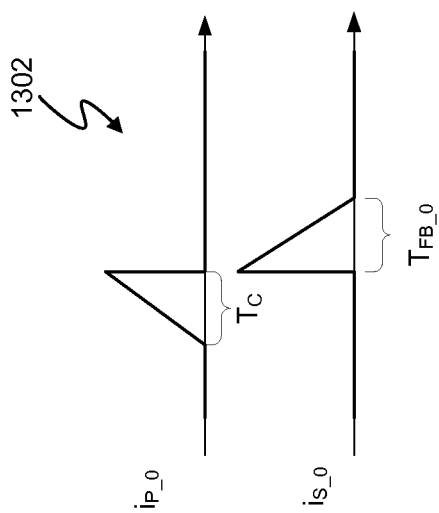

FIG. 13 depicts waveforms 1302 and 1304, which depict exemplary primary-side and secondary-side currents for the flyback power dissipation circuits 1000 and 1100. Referring to FIGS. 12 and 13, current $i_{P\_0}$ and $i_{S\_0}$ in waveforms 1302 represent respective primary-side and secondary-side currents. When there is no active control of power dissipation by controller 506 in the flyback path power dissipation circuit 1200, flyback switch 1104 is ON during the charging phase $T_C$ during which primary-side current $i_{P\_0}$ ramps up. When controller 506 turns the flyback switch 1104 OFF, the flyback phase $T_{FB\_0}$ begins. As with the lighting system 500, in at least one embodiment, the controller 506 generates the control signal $CS_2$ to operate flyback switch 1104 in an efficient mode when not dissipating power by the flyback switch 1104.

Referring to waveforms 1304, when controller 506 actively controls power dissipation in the flyback path power dissipation circuit 1200, in at least one embodiment, the current source 1202 generates the primary-side limit current $i_{LIM\_FB}$ to limit the primary-side current $i_P$ and delay the flyback phase $T_{FB\_1}$ until completion of the power dissipation phase $T_{PD}$. During the power dissipation phase $T_{PD}$, the primary-side current $i_P$ is constant, so the voltage across the primary-side coil 1010 is zero, and power is dissipated through the flyback FET 1104 and the current source 1202.

Figure 14:
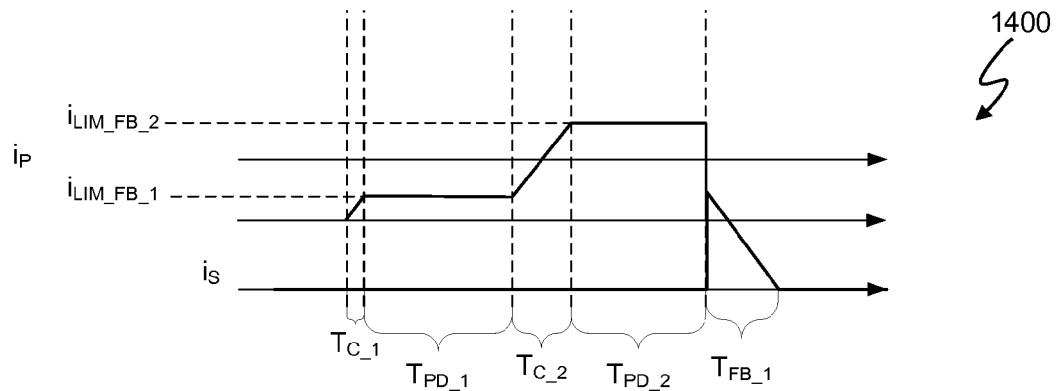

FIG. 14 depicts waveforms 1400, which depict exemplary primary-side and secondary-side currents for the flyback power dissipation circuits 1000 and 1100. In at least one embodiment, the controller 506 coordinate multiple primary-side limit currents, such as limit currents $i_{LIM\_FB\_1}$ and $i_{LIM\_FB\_2}$ to stage the power dissipation by the flyback path power dissipation circuit 1200. Controller 506 can control the multiple limit currents $i_{LIM\_FB\_1}$ and $i_{LIM\_FB\_2}$ by setting the reference current $i_{REF}$ with the controls signal $C_{IREF}$, setting the scaling factor Z with the control signal $C_{SCALE}$, or setting both the reference current $i_{REF}$ and the scaling factor Z, as described in conjunction with the current source 602 (FIG. 6). Staging the power dissipation by the flyback power dissipation circuit 1200 to, for example, thermally manage power dissipation by the flyback switch 1104 and the current source 1202.

Figure 15:
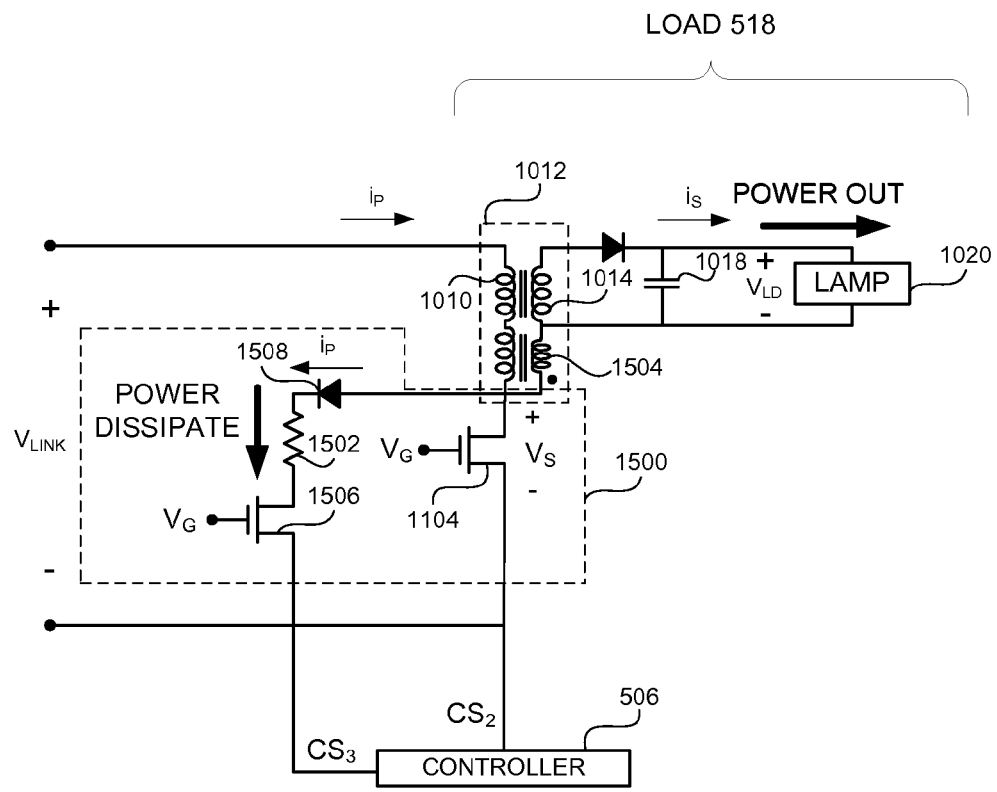
FIG. 15 depicts another embodiment of the flyback path power dissipation circuit of FIG. 10.

FIG. 15 depicts a flyback path power dissipation circuit 1500, which represents one embodiment of the flyback path power dissipation circuit 1002. In at least one embodiment, the flyback path power dissipation circuit 1500 dissipates power through a resistor 1502. An auxiliary power winding 1504 receives energy from the primary-side coil 1210 during a flyback phase of the primary-side coil. A gate voltage $V_G$ biases a gate of FET 1506, and controller 506 controls the conductivity of FET 1506 with source control signal $CS_3$. When the controller 506 determines that POWER IN does not equal POWER OUT+$P_{INH}$, the controller 506 turns FET 1506 ON, which allows current $i_{AUX}$ from the auxiliary winding 1504 to flow through diode 1508 and through resistor 1502. In at least one embodiment, the controller 506 dissipates an amount of power equal to a difference between POWER IN and POWER OUT+$P_{INH}$ over one or more cycles of the auxiliary current $i_{AUX}$.

Figure 16:
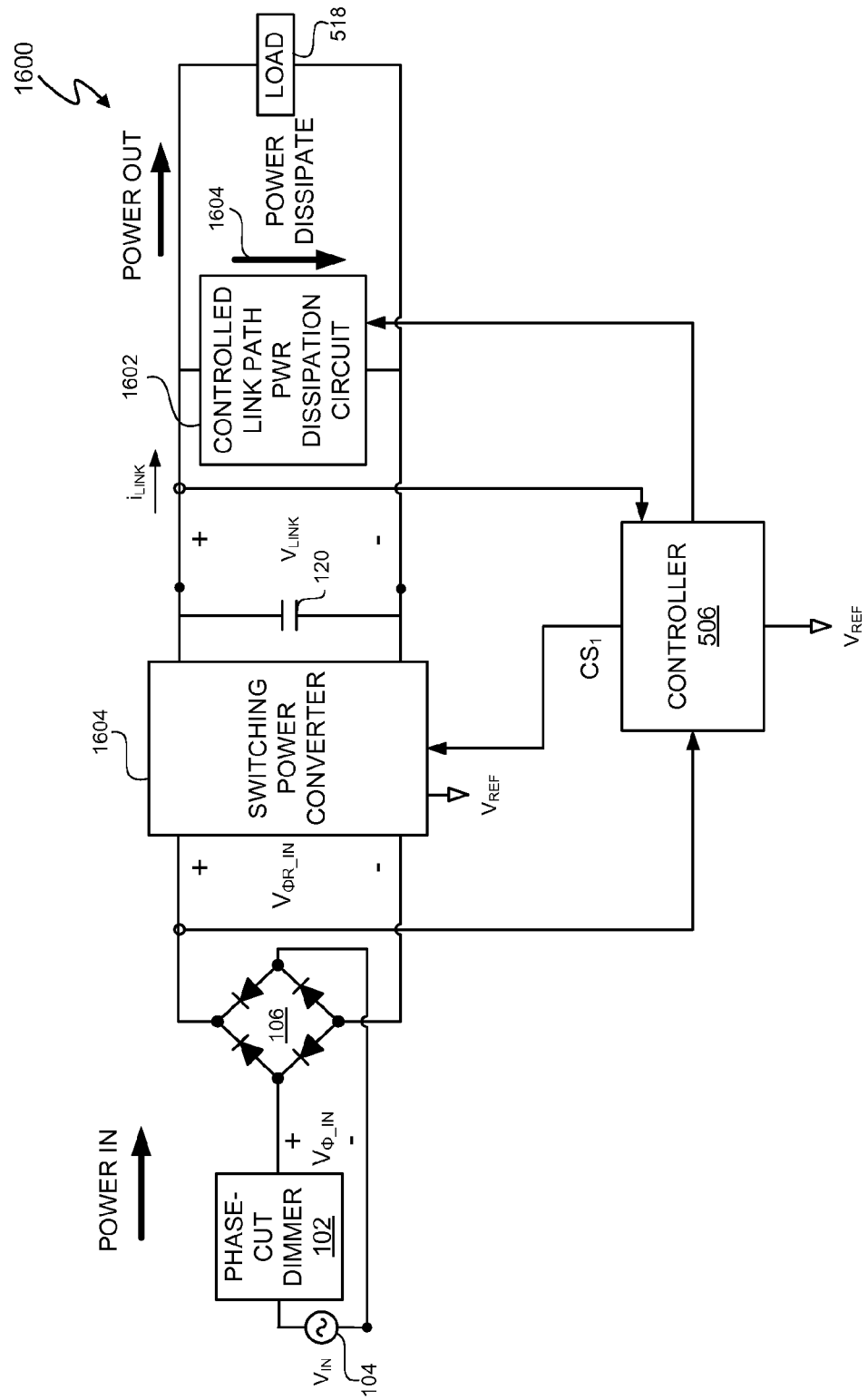
FIG. 16 depicts a lighting system that includes a link path power dissipation circuit.

FIG. 16 depicts a lighting system 1600 that represents one embodiment of lighting system 400. Lighting system 1600 includes a link path power dissipation circuit 1602 to dissipate excess power in the lighting system 1600. The link path power dissipation circuit 1602 represents one embodiment of the link path power dissipation circuit 404. In general, when the POWER IN exceeds the POWER OUT+ $P_{INH}$, the link path power dissipation circuit 1602 dissipates excess energy through the output power dissipation path 1604. In at least one embodiment, the link path power dissipation circuit 1602 monitors the link voltage $V_{LINK}$. When the POWER IN exceeds the POWER OUT+$P_{INH}$, the link voltage $V_{LINK}$ will increase if excess energy is not dissipated by the lighting system 1600. Thus, in at least one embodiment, the link path power dissipation circuit 1602 monitors the link voltage $V_{LINK}$, and when the link voltage $V_{LINK}$ exceeds a predetermined reference link voltage, the link path power dissipation circuit 1602 dissipates the excess energy. The particular implementation and control of the link path power dissipation circuit 1602 is a matter of design choice.

Figure 17:
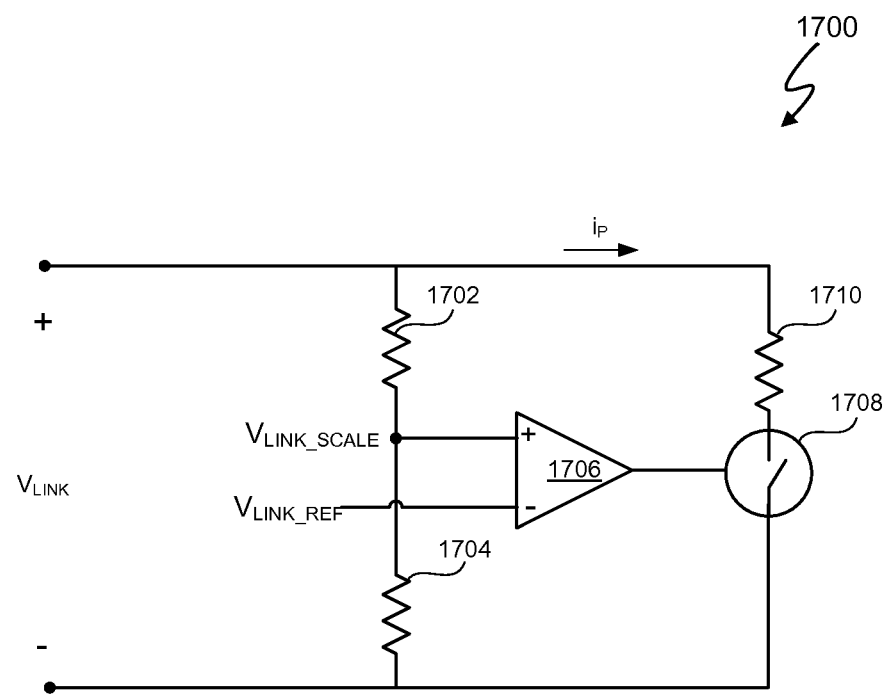
FIGS. 17 and 18 depict respective exemplary embodiments of the link path power dissipation circuit of FIG. 16.

FIG. 17 depicts an exemplary link path power dissipation circuit 1700, which represents one embodiment of the link path power dissipation circuit 1602. The link path power dissipation circuit 1700 includes series connected resistors 1702 and 1704 that form a resistor-based voltage divider to generate a scaled link voltage $V_{LINK\_SCALE}$. The link path power dissipation circuit 1700 monitors the link voltage $V_{LINK}$ by comparing the scaled link voltage $V_{LINK\_SCALE}$ with a reference link voltage $V_{LINK\_REF}$. The reference link voltage $V_{LINK\_REF}$ establishes a threshold for power dissipation by the link path power dissipation circuit 1700. The scaled link voltage $V_{LINK\_SCALE}$ biases the non-inverting input terminal of the comparator 1706, and the reference link voltage $V_{LINK\_REF}$ biases the inverting input terminal of the comparator 1706. When the scaled link voltage $V_{LINK\_SCALE}$ exceeds the reference link voltage $V_{LINK\_REF}$, the comparator 1706 biases a switch 1708, which causes the primary current $i_P$ to flow through power dissipation resistor 1710 and switch 1708. The implementation of switch 1708 is a matter of design choice. In at least one embodiment, switch 1708 is a bipolar junction transistor (BJT), and the comparator 1706 biases a base of the BJT switch 1708. In at least one embodiment, switch 1708 is FET, and the comparator 1706 biases a gate of the FET switch 1708. Reciprocally, when the scaled link voltage $V_{LINK\_SCALE}$ is less than the reference link voltage $V_{LINK\_REF}$, the comparator 1706 turns the switch 1708 OFF, which stops current flow in and power dissipation by the power dissipation resistor 1710. The particular link voltage $V_{LINK}$ corresponding to the reference link voltage $V_{LINK\_REF}$ is a matter of design choice and is, for example, 105%-120% of a normal operating link voltage $V_{LINK}$. In at least one embodiment, the reference link voltage $V_{LINK\_REF}$ is approximately 115% for an input voltage $V_{IN}$ equal to 110 Vrms and 107% for an input voltage $V_{IN}$ equal to 230 Vrms.

Figure 18:
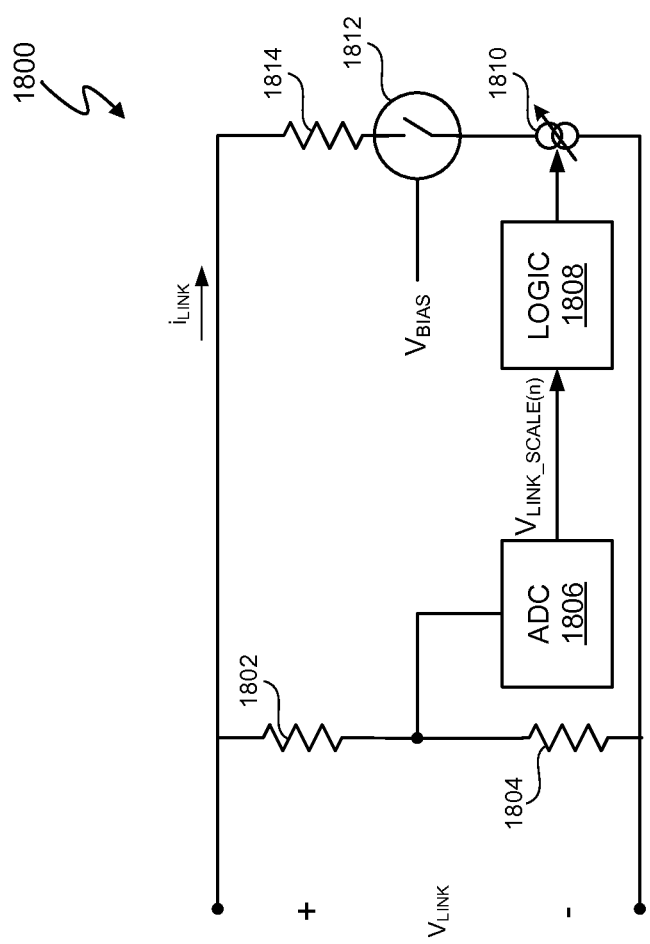

FIG. 18 depicts an exemplary link path power dissipation circuit 1800, which represents one embodiment of the link path power dissipation circuit 1602. The link path power dissipation circuit 1800 includes series connected resistors 1802 and 1804 that form a resistor-based voltage divider to generate a scaled link voltage $V_{LINK\_SCALE}$. The link path power dissipation circuit 1800 monitors the link voltage $V_{LINK}$ by using the analog-to-digital converter 1806 to convert the analog scaled link voltage $V_{LINK\_SCALE}$ into a digital value scaled link voltage $V_{LINK\_SCALE}(n)$. Logic 1808 determines if the link path power dissipation circuit 1800 should dissipate excess energy by determining if the scaled link voltage $V_{LINK\_SCALE}$ indicates that the link voltage $V_{LINK}$ is greater than a particular threshold value. The particular threshold value is a matter of design choice and is, for example, 105%-120% of a normal operating link voltage $V_{LINK}$. If the logic 1808 determines that the link path power dissipation circuit 1800 should dissipate excess energy, the logic 1808 controls conductivity of switch 1812. In at least one embodiment, switch 1812 is a BJT, and the logic 1808 controls the current source 1812 to bias an emitter of the BJT switch 1812 and control flow of the primary current $i_P$ through the power dissipation resistor 1814. In at least one embodiment, switch 1812 is a FET, and the logic 1808 controls the current source 1812 to bias a source of the FET switch 1812 and control flow of the primary current $i_P$ through the power dissipation resistor 1814.

The implementation of the logic 1808 and current source 1810 is a matter of design choice. In at least one embodiment, the current source 1810 is identical to the current source 602 (FIG. 6), and the logic 1808 can control the reference current (not shown) and/or the scaling factor (not shown) of the current source 1810. In at least one embodiment, the logic 1808 comprises a processor (not shown) that executes code to determine the particular intermixing, interspersing, and limits for the primary current during power dissipation in accordance with a predetermined algorithm. In at least one embodiment, the algorithm is stored as executable code in a memory (not shown) of the logic 1808. The particular algorithm is a matter of design choice. In at least one embodiment, the algorithm causes the power dissipation resistor 1814 to dissipate power until the scaled link voltage $V_{LINK\_SCALE}$ indicates that the link voltage $V_{LINK}$ has declined to a predetermined value, such as a normally operating level for the lamp 418 (FIGS. 4 and 16).

Figure 19:
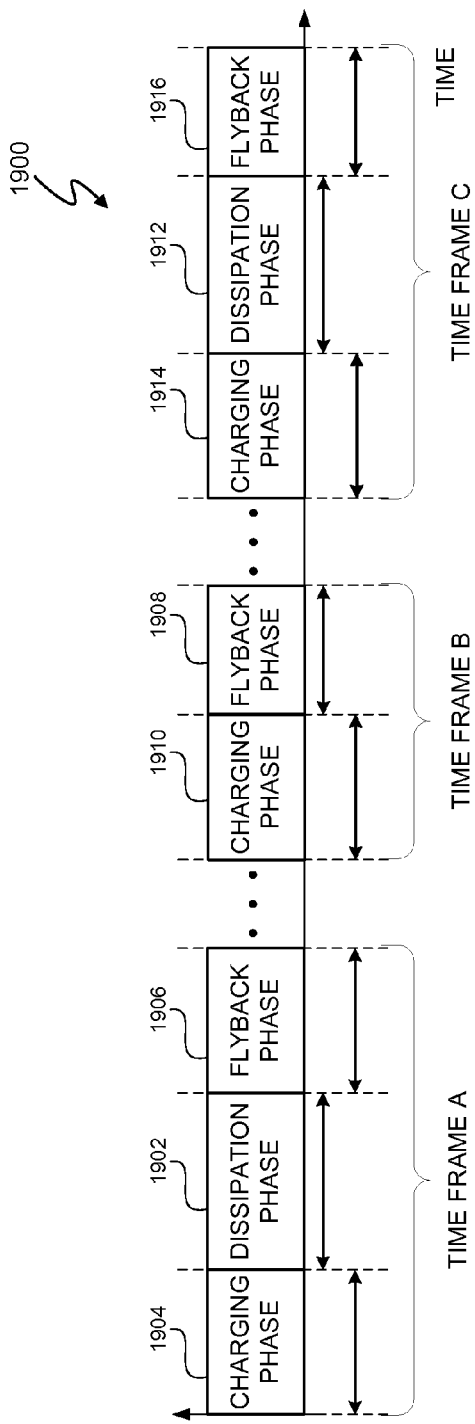
FIG. 19 depicts an exemplary power dissipation phase interspersing timeline.

Referring to FIG. 4, in at least one embodiment, controller 408 controls the switch path power dissipation circuit 402, the link path power dissipation circuit 404, and/or the flyback path power dissipation circuit 406 to dissipate power when the POWER IN is greater than the POWER OUT+ $P_{INH}$ plus the inherent losses of the lighting system 400. In at least one embodiment, the controller 408 can introduce power dissipation phases as needed to dissipate excess energy. FIG. 19 depicts an exemplary power dissipation phase interspersing timeline 1900 for three exemplary time frames A, B, and C. In at least one embodiment, a single timeframe, such as time frames A, B, or C, refers to a time between when a first charging phase following an immediately preceding flyback phase begins and a flyback phase immediately preceding a next charging phase ends. In time frame A, the power dissipation phase 1902 is interspersed between charging phase 1904 and flyback phase 1906. In a subsequent time frame B of the rectified input voltage $V_{\phi R\_IN}$, the flyback phase 1908 immediately follows the charging phase 1910, and, there is no power dissipation phase in time frame B. Time frame B can be a consecutive time frame after time frame A or a non-consecutive time frame. A controller 506 (FIG. 5) can avoid including a power dissipation phase in time frame B for a variety of reasons, such as when the POWER IN equals the POWER OUT+ $P_{INH}$ or to allow components to cool prior to initiating another power dissipation phase. In time frame C of the rectified input voltage $V_{\phi R\_IN}$, controller 506 intersperse the power dissipation phase 1912 between charging phase 1914 and flyback phase 1916.

Figure 20:
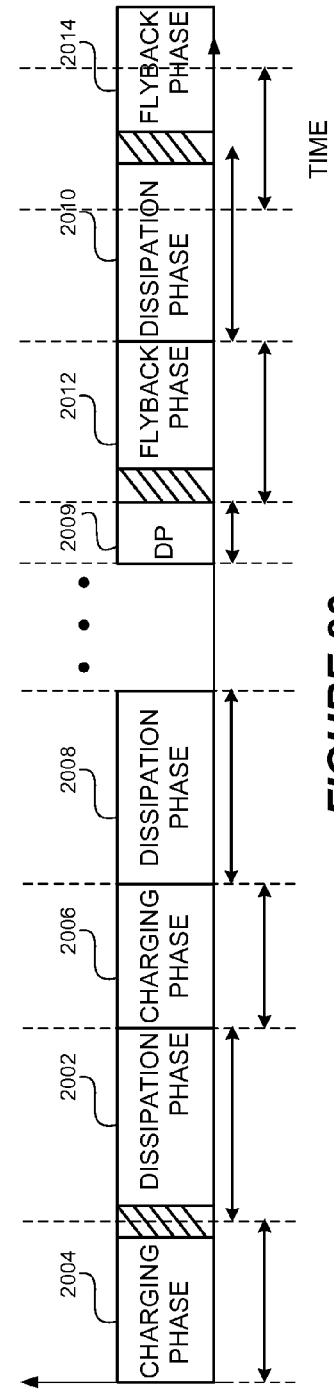
FIG. 20 depicts an exemplary power dissipation intermixing and interspersing timeline.

FIG. 20 depicts an exemplary power dissipation intermixing and interspersing timeline 2000 for a single timeframe. In at least one embodiment, a single timeframe refers to a time between when a first charging phase following an immediately preceding flyback phase begins and a flyback phase immediately preceding a next charging phase ends. The power dissipation phase 2002 is intermixed with the charging phase 2004 and interspersed with a subsequent charging phase 2006. A subsequent power dissipation phase 2008 occurs after the charging phase 2006. The power dissipation phase 2010 is interspersed between flyback phases 2012 and 2014 and also intermixed with flyback phase 2014. The power dissipation phase 2009 begins after the beginning of the charging phase 2006 and before an end of the subsequent flyback phase 2012. The number and timing of interspersed and intermixed charging and flyback phases and power dissipation phases is a matter of design choice and depends on, for example, an amount of power to be dissipated and thermal management of components.

Thus, a lighting system includes one or more methods and systems to control dissipation of excess power in the lighting system when the power into a switching power converter from a leading edge, phase-cut dimmer is greater than the power out of the switching power converter. In at least one embodiment, to control dissipation of the excess energy, the controller controls one or more power dissipation circuits during one or more controlled power dissipation phases. In at least one embodiment, the controller creates one or more intermixed and/or interspersed power dissipation phases with one or more switching power converter charging and/or flyback phases.

Although embodiments have been described in detail, it should be understood that various changes, substitutions, and alterations can be made hereto without departing from the spirit and scope of the invention as defined by the appended claims.

What is claimed is:

1. An apparatus comprising:
    a controller configured to generate a first control signal to control a flyback switch coupled to a primary-side transformer coil in an output stage of a switching power converter in a phase cut compatible, dimmable lighting system, wherein the controller is further configured to generate a second control signal to control a power dissipation circuit coupled in series with the flyback switch to dissipate excess energy in the flyback switch during a controlled power dissipation phase, and the controlled power dissipation phase exclusively occurs after a charging phase begins and before an end of a subsequent flyback phase of the switching power converter, wherein the excess energy comprises more energy than an amount of energy to be provided to a load coupled to the switching power converter plus inherent energy losses.

2. The apparatus of claim 1 further comprising:
    a current source coupled to the flyback switch and controlled by the controller to control current through the flyback switch during the charging phase of the switching power converter.

3. The apparatus of claim 2 wherein the current source is a constant current source.

4. The apparatus of claim 1 wherein the controller is further configured to control a duration of the charging phase to control an amount of energy dissipated in the flyback switch.

5. The apparatus of claim 1 wherein the power dissipation phase begins at an end of the charging phase and ends before a beginning of a next flyback phase.

6. The apparatus of claim 1 wherein the power dissipation phase begins prior to an end of the charging phase of the switching power converter and ends after a beginning of a next flyback phase of the switching power converter.

7. The apparatus of claim 1 wherein the charging phase occurs during the flyback phase of the switching power converter.

8. The apparatus of claim 1 wherein the controller is configured to control a member of a group consisting of: current in the flyback switch, a conduction time of the flyback switch, or the current and the conduction time of the flyback switch.

9. The apparatus of claim 1 further comprising:
    an active circuit to dissipate power at the output of a switching power converter when the switching power converter receives more energy than an amount of energy to be provided to a load coupled to the switching power converter.

10. The apparatus of claim 1 wherein the apparatus further comprises at least one member a group consisting of:
    a boost switch in a switching power converter of a phase cut compatible, dimmable lighting system, wherein the controller is configured to control a switch path power dissipation circuit to control dissipation of excess energy by at least the boost switch during a controlled power dissipation phase, and the controlled power dissipation phase occurs after a charging phase begins and before an end of a subsequent flyback phase of the switching power converter; and
    an active circuit to dissipate power at the output of a switching power converter when the switching power converter receives more energy than an amount of energy to be provided to a load coupled to the switching power converter.

11. The apparatus of claim 10 further comprising:
    one or more light emitting diodes; and
    the switching power converter coupled to the one or more light emitting diodes.

12. An apparatus comprising:
    a controller configured to control a flyback switch coupled to a primary-side transformer coil in an output stage of a switching power converter in a phase cut compatible, dimmable lighting system, wherein the controller is further configured to control the flyback switch in an efficient mode and a power dissipation mode, wherein in the efficient mode, the controller is configured to operate the flyback switch to minimize power dissipation in the flyback switch and in the power dissipation mode the controller is configured to operate the flyback switch to increase dissipation of energy in the flyback switch, relative to any power dissipation in the flyback switch during operation in the efficient mode, to dissipate excess energy representing more energy than an amount of energy to be provided to a load coupled to the switching power converter plus inherent energy losses, wherein in the efficient mode the controller is configured to generate a control signal to cause a charging current to flow through the flyback switch during a charging phase of the switching power converter and cut-off current through the flyback switch during a flyback phase during the efficient mode and is further configured to limit current through the flyback switch to an intermediate value between the charging current and zero during the power dissipation mode.

13. The apparatus of claim 12 wherein the controller is configured to generate a control signal to control conductivity of the flyback switch and in the efficient mode, the controller is further configured to generate the control signal using two states in the efficient mode and is further configured to generate the control signal using at least three states in the power dissipation mode, wherein the at least three states in the power dissipation mode occur during a time beginning with a charging phase of the primary-side transformer coil and an end of an immediately subsequent flyback phase of the primary-side transformer coil.

14. The apparatus of claim 12 wherein the controller is configured to intersperse multiple efficient and power dissipation modes during a charging phase of the switching power converter and during a flyback phase.

15. A method comprising:
    controlling with a first control signal a flyback switch coupled to a primary-side transformer coil in an output stage of a switching power converter in a phase cut compatible, dimmable lighting system; and controlling with a second control signal a power dissipation circuit coupled in series with the flyback switch to dissipate excess energy in the flyback switch during a controlled power dissipation phase, and the controlled power dissipation phase occurs exclusively after a charging phase begins and before an end of a subsequent flyback phase of the switching power converter, wherein the excess energy comprises more energy than an amount of energy to be provided to a load coupled to the switching power converter plus inherent energy losses.

16. The method of claim 15 further comprising:
controlling a current source, coupled to the flyback switch, and the flyback switch with a controller to control current through the flyback switch during the charging phase of the switching power converter.

17. The method of claim 16 wherein the current source is a constant current source.

18. The method of claim 15 further comprising:
controlling a duration of the charging phase to control an amount of energy dissipated in the flyback switch.

19. The method of claim 15 wherein the power dissipation phase begins at an end of the charging phase and ends before a beginning of a next flyback phase.

20. The method of claim 15 wherein the power dissipation phase begins prior to an end of the charging phase of the switching power converter and ends after a beginning of a next flyback phase of the switching power converter.

21. The method of claim 15 wherein the charging phase occurs during the flyback phase of the switching power converter.

22. The method of claim 15 further comprising:
controlling a member of a group consisting of: current in the flyback switch, a conduction time of the flyback switch, or the current and the conduction time of the flyback switch.

23. The method of claim 15 further comprising:
dissipating power in a link path of the switching power converter when the switching power converter receives more energy than an amount of energy to be provided to a load coupled to the switching power converter.

24. The method of claim 15 further comprising:
controlling a boost switch in a switching power converter of a phase cut compatible, dimmable lighting system; and
controlling a switch path power dissipation circuit to control dissipation of excess energy by at least the boost switch during a controlled power dissipation phase, and the controlled power dissipation phase occurs after a charging phase begins and before an end of a subsequent flyback phase of the switching power converter.

25. The method of claim 24 further comprising:
dissipating power in a link path of the switching power converter when the switching power converter receives more energy than an amount of energy to be provided to a load coupled to the switching power converter.

26. The method of claim 24 further comprising:
controlling one or more light emitting diodes.

27. A method comprising:
controlling a flyback switch coupled to a primary-side transformer coil in an output stage of a switching power converter in a phase cut compatible, dimmable lighting system; and
controlling the flyback switch in an efficient mode and a power dissipation mode,
wherein controlling the flyback switch in the efficient mode comprises:
operating the flyback switch to minimize power dissipation in the flyback switch;
generating a control signal to control conductivity of the flyback switch;
generating the control signal using two states in the efficient mode; and
generating the control signal using at least three states in the power dissipation mode,
wherein the at least three states in the power dissipation mode occur during a time beginning with a charging phase of the primary-side transformer coil and an end of an immediately subsequent flyback phase of the primary-side transformer coil; and
wherein controlling the flyback switch in the power dissipation mode comprises:
operating the flyback switch to increase dissipation of excess energy in the flyback switch relative to any power dissipation in the flyback switch during operation in the efficient mode, wherein the excess energy comprises more energy than an amount of energy to be provided to a load coupled to the switching power converter plus inherent energy losses.

28. The method of claim 27 further comprising:
interspersing multiple efficient and power dissipation modes during a charging phase of the switching power converter and during a flyback phase.

29. The method of claim 27 wherein:
in the efficient mode, the method further comprises:
generating a control signal to cause a charging current to flow through the flyback switch during a charging phase of the switching power converter and cut-off current through the flyback switch during a flyback phase during the efficient mode; and
in the power dissipation mode the method further comprises:
limiting current through the flyback switch to an intermediate value between the charging current and zero during the power dissipation mode.

30. The apparatus of claim 12 further comprising:
a current source coupled to the flyback switch and controlled by the controller to control current through the flyback switch during the charging phase of the switching power converter.

31. The method of claim 15 further comprising:
controlling a current source, coupled to the flyback switch, and the flyback switch with a controller to control current through the flyback switch during the charging phase of the switching power converter.

* * * * *